(12) United States Patent
Takei

(10) Patent No.: US 9,178,049 B2
(45) Date of Patent: Nov. 3, 2015

(54) MOS TYPE SEMICONDUCTOR DEVICE

(71) Applicant: FUJI ELECTRIC CO., LTD., Kawasaki (JP)

(72) Inventor: Manabu Takei, Shiojiri (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 14/019,269

(22) Filed: Sep. 5, 2013

(65) Prior Publication Data
US 2014/0061719 A1    Mar. 6, 2014

(30) Foreign Application Priority Data

Sep. 6, 2012    (JP) .................................. 2012-196080

(51) Int. Cl.
*H01L 29/739* (2006.01)
*H01L 29/40* (2006.01)
*H01L 29/66* (2006.01)

(52) U.S. Cl.
CPC .......... *H01L 29/7396* (2013.01); *H01L 29/402* (2013.01); *H01L 29/6634* (2013.01); *H01L 29/7395* (2013.01); *H01L 29/7397* (2013.01)

(58) Field of Classification Search
CPC ................ H01L 29/7396; H01L 29/78; H01L 21/02107
USPC .................................. 257/139, 355; 438/694
See application file for complete search history.

(56) References Cited

U.S. PATENT DOCUMENTS

| | | | |
|---|---|---|---|
| 6,111,290 A | | 8/2000 | Uenishi et al. |
| 2002/0063300 A1 | | 5/2002 | Miyajima |
| 2005/0056912 A1 | * | 3/2005 | Ninomiya et al. ............. 257/565 |
| 2007/0052014 A1 | * | 3/2007 | Takahashi ...................... 257/330 |
| 2008/0001217 A1 | * | 1/2008 | Kawashima ................... 257/330 |
| 2013/0075819 A1 | * | 3/2013 | Takei et al. .................... 257/355 |

FOREIGN PATENT DOCUMENTS

| | | | | |
|---|---|---|---|---|
| JP | 2000-91572 A | 3/2000 | | |
| JP | 2002-26322 A | 1/2002 | | |
| JP | 2002-164541 A | 6/2002 | | |
| JP | 2007-74006 A | 3/2007 | | |
| JP | 2010-141310 | 6/2010 | | |
| JP | 2011-176249 | 9/2011 | | |
| JP | 2012099079 | * | 7/2012 | .............. H01L 29/78 |

* cited by examiner

*Primary Examiner* — Kenneth Parker
*Assistant Examiner* — Young W Kim

(57) ABSTRACT

A MOS type semiconductor device wherein on voltage is low, the rate of rise of current at turn-on time is low, and it is possible to hold down the rate of rise of collector current at turn-on time, and reduce radiation noise. The device includes a stripe-shaped plan-view pattern of protruding semiconductor region on an n-type substrate and having a p-type region sandwiched between an upper side n-type first region and a lower side n-type second region, a top flat portion including a depression region with a depth reaching the p-type region, and an inclined portion between the top flat portion and a bottom flat portion around the protruding semiconductor region; and a gate electrode with one end portion of the gate electrode on a surface within the inclined portion, and another end portion on a surface of the lower side n-type second region in the p-type region side vicinity.

6 Claims, 27 Drawing Sheets

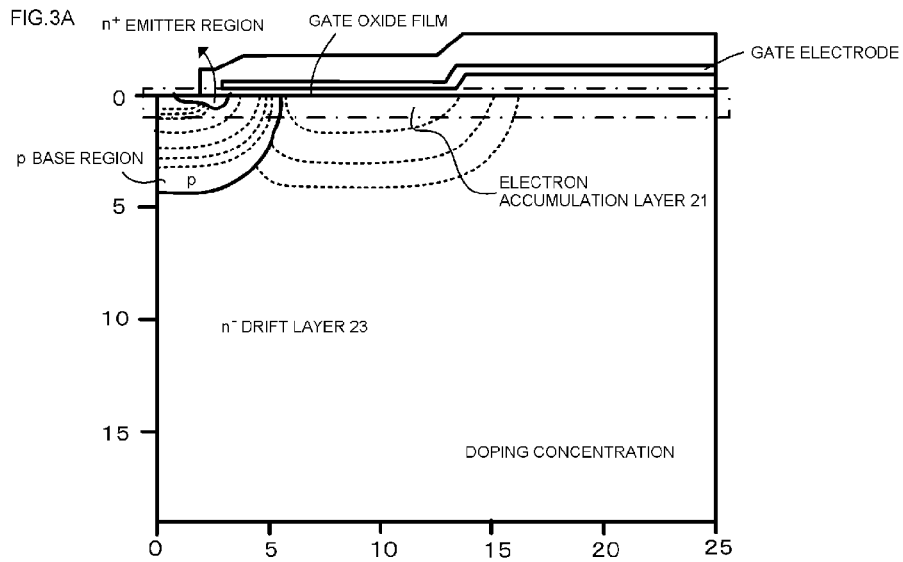
FIG.3A
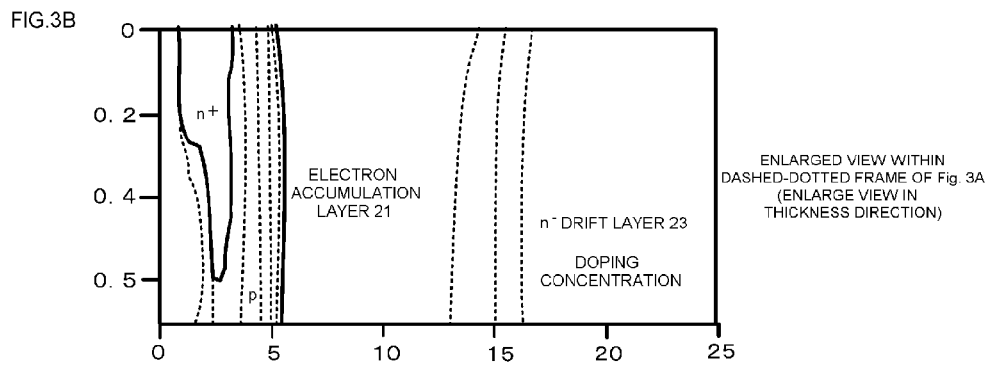
FIG.3B ENLARGED VIEW WITHIN DASHED-DOTTED FRAME OF Fig. 3A (ENLARGE VIEW IN THICKNESS DIRECTION)
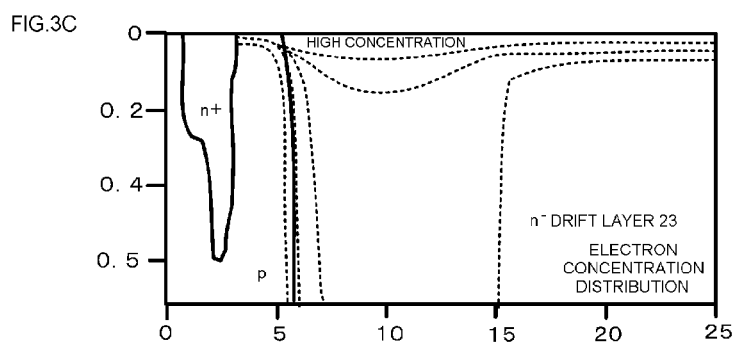
FIG.3C
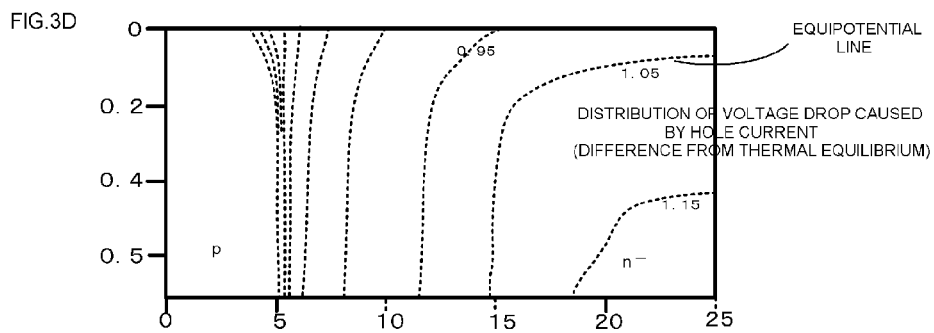
FIG.3D

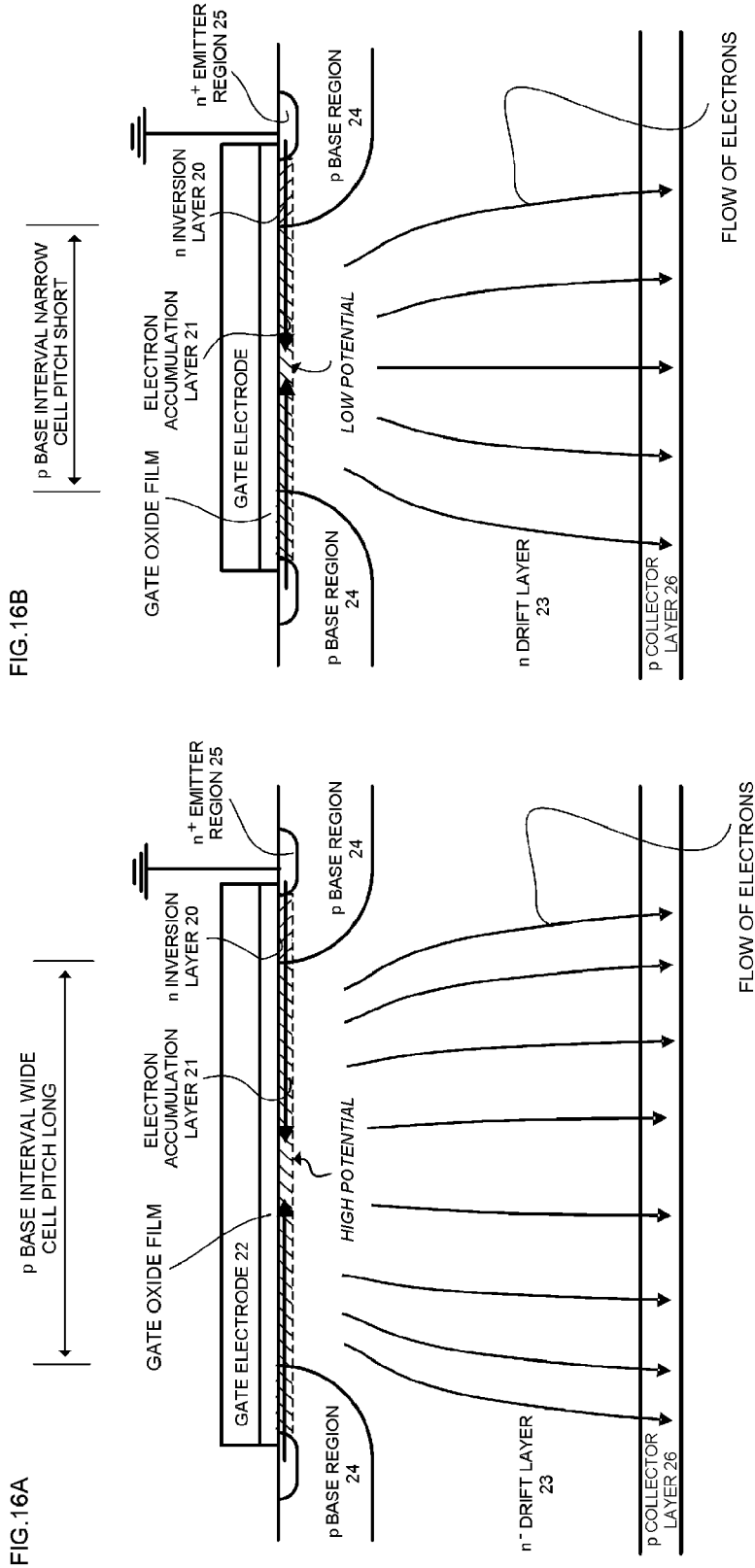

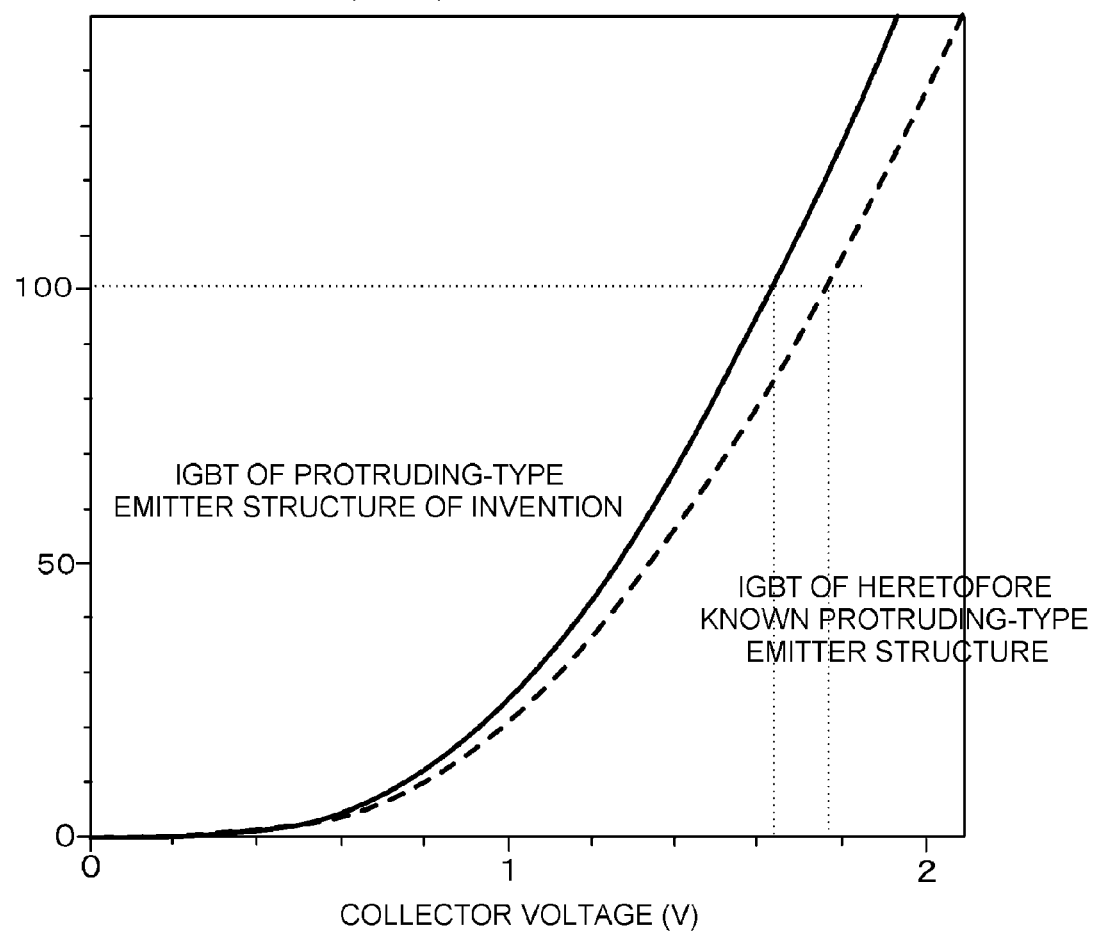

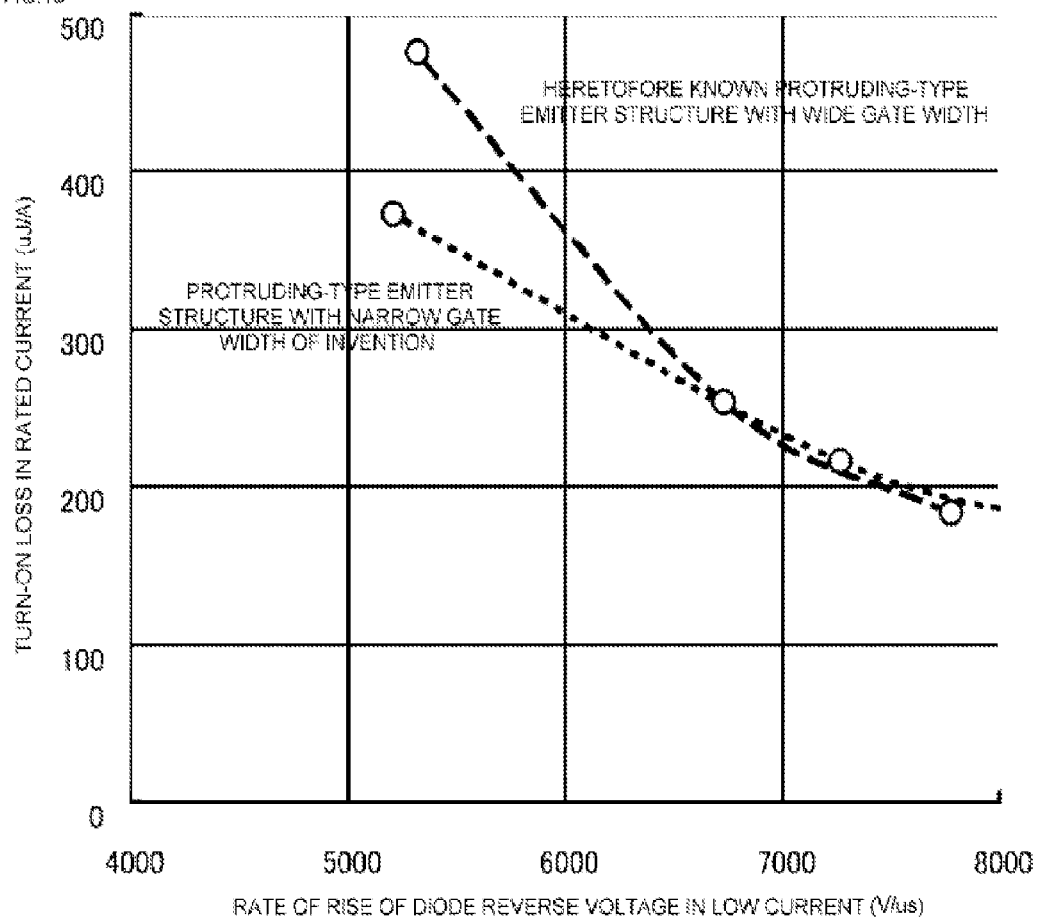

MOS TYPE SEMICONDUCTOR DEVICE

CROSS-REFERENCE TO RELATED APPLICATIONS

This application claims the foreign priority benefit of Japanese Application No. 2012-196080, filed Sep. 6, 2012, in the Japanese Intellectual Property Office, the disclosure of which is incorporated herein by reference.

BACKGROUND

1. Field

Embodiments of the present invention relate to a power semiconductor device used in a power conversion system or the like, and more particularly, to an insulated gate bipolar transistor (IGBT).

2. Description of the Related Art

The on voltage of an IGBT is of approximately the value of a combination of the respective voltage drops in a surface electron layer formed of an inversion layer and electron accumulation layer immediately below a gate insulator on the surface of a semiconductor substrate, a drift layer which is a high resistance layer, a backside pn junction (collector junction), and the like. It is sufficient to reduce each voltage drop in order to reduce the on voltage. In order to reduce the voltage drop in the surface electron layer, it is effective to reduce the cell pitch. Assuming that the bulk current density in the semiconductor substrate is constant, the shorter the cell pitch, the less the current assigned to each MOS structure (each MOS structure per unit cell), as shown in FIGS. 16A and 16B which are cell sectional views showing a comparison of electron current paths in planar gate type IGBTs with different cell pitches, meaning that the voltage drop in the surface electron layer decreases.

Furthermore, in the case of the planar gate type IGBT, as the lateral length (the distance between p base regions 24) of an electron accumulation layer 21 becomes shorter as the cell pitch decreases, the voltage drop in the electron accumulation layer 21 decreases. Also, in the planar gate type IGBT, electrons injected from an n$^+$emitter region 25 by way of an n channel (an n inversion layer 20) flow parallel to (along) a principal surface through not only the accumulation layer 21 but the surface side vicinity of a drift layer 23, expand all over the unit cells, and flow toward the backside. As the distance the electron current flows along the principal surface decreases when the cell pitch is reduced, the voltage drop in the vicinity of the surface decreases. Conversely, when the cell pitch is long, the current density in a surface region of the drift layer 23 close to the n channel (n inversion layer 20) is high, but the current density in a remote surface region is low, meaning that it cannot be said that the region in which the current density is low is an efficient electron current path. The same is equally true of a trench gate type IGBT.

In order to reduce the voltage drop in the drift layer 23 of the IGBT, it is effective to raise the carrier concentration in the drift layer 23. However, when the carrier concentration in the drift layer 23 increases, turn-off loss increases. Moreover, a trade-off relationship exists between the turn-off loss and voltage drop. As a depletion layer starts to extend from the surface side pn junction (the pn junction between the p base region 24 and n drift layer 23) at IGBT turn-on time, firstly, surface side carriers are swept out. Consequently, the surface side carriers are swept out when the bias between a p collector layer 26 and the n emitter region 25 is comparatively low, and the turn-off loss represented by the product of voltage and current at this time lowers.

That is, with regard to the previous description "it is effective to raise the carrier concentration in the drift layer 23", it can be said that it is particularly preferable to raise the surface side carrier concentration more than the backside carrier concentration because it is possible to lower the turn-off loss with respect to the same on voltage by improving a heretofore known injection enhancement (IE) effect, and thus possible to weaken the trade-off relationship.

In order to increase the surface side carrier concentration, it is effective to reduce the area of the p base region 24 which is a carrier inlet. The surface side p base region 24 corresponds to the collector of a parasitic pnp bipolar transistor (p collector layer 26-n drift layer 23-p base region 24), and the pn junction (the pn junction between the p base region 24 and n drift layer 23) is slightly reverse biased, meaning that the carrier concentration in the vicinity of the p base region 24 is very likely to be low. Consequently, in both the planar gate structure and trench gate structure, as the ratio of the region in which the carrier concentration is low decreases by lowering the area ratio per unit cell of the p base region 24, the average surface side carrier concentration rises. In other words, it is preferable to lower the area ratio of the previously described parasitic bipolar transistor.

With the trench gate structure, as shown in the cell sectional view of the trench gate type IGBT of FIG. 2, the lateral diffusion of a p base region 30 (the dotted line region) can be prevented by trenches 31, and the area of the p base region 30 can be reduced compared with the planar gate structure having the same channel perimeter (overall channel width). Consequently, the trench gate structure is more advantageous than the planar gate structure in terms of an increase in average surface carrier concentration.

Also, when the p base region area ratio is reduced, the hole current density in the vicinity of the p base region rises when the current density in the bulk is constant. In both the planar gate structure and trench gate structure, as the hole current density in a drift layer (an n$^-$ layer) in contact with an electron accumulation layer (an n$^+$layer) rises, voltage drop caused by hole current occurs. Alternatively, voltage for maintaining large hole current as drift current is generated in the drift layer (n$^-$layer). As a surface electron layer is low in resistance, the respective voltage drops in an electron inversion layer (an n channel) and the electron accumulation layer are low, the junction of the electron accumulation layer (n$^+$layer) and drift layer (n$^-$layer) is forward biased by the difference between the voltage drops, and electrons are injected from the electron accumulation layer by the same action as electron injection on the cathode side of a pin diode.

With regard to how the electron accumulation layer 21 and drift layer 23 are forward biased, FIGS. 3A and 3B respectively show a sectional view of an impurity concentration distribution in the vicinity of a surface cell and a sectional view wherein the substrate surface layer (within the dashed-dotted frame) of FIG. 3A is enlarged in the width direction. With regard to an electron carrier concentration distribution, in the same way, FIGS. 3C and 3D respectively show a sectional view wherein the substrate surface layer (within the dashed-dotted frame) of FIG. 3A is enlarged in the width direction, and a sectional view wherein the substrate surface layer (within the dashed-dotted frame) of FIG. 3A is enlarged in the width direction in order to show voltage drop caused by hole current using an equipotential line distribution. When seeing the voltage drop equipotential line distribution map of FIG. 3D, the equipotential lines of the drift layer 23 immediately below the surface electron accumulation layer 21 become more dense in the horizontal direction (in the left-right direction of FIG. 3D) than the equipotential lines of the surface electron accumulation layer 21. Consequently, the potential of the drift layer 23 immediately below the electron accumulation layer 21 becomes more positive than that of the electron accumulation layer 21. This effect leads to a rise in the carrier concentration in the surface vicinity of the drift layer 23. The carrier concentration increases in a forward-bias exponential manner. As the voltage drop caused by hole current is recorded as one portion of on voltage, the on voltage is caused to rise slightly, but the carrier concentration is caused to rise, meaning that the voltage drop in the drift layer 23 occupying a large portion of the on voltage decreases, and the on voltage lowers as a whole. In particular, in a high-voltage IGBT wherein the voltage drop in the drift layer 23 is high, the effect of increasing the carrier concentration is prominent.

In the trench gate structure of FIG. 2, when the aspect ratio (the depth/width) of an n-type mesa region (an n-type region 23a, sandwiched between the trenches 31, which is one portion of the drift layer 23) immediately below the p base region 30 is increased into a vertically long structure, large hole current flows through a narrow and long region, meaning that the forward bias of the drift layer 23 ($n^-$layer) in contact with the electron accumulation layer, in the trench 31 bottom portion, becomes higher, electron injection is promoted, and the carrier concentration becomes higher.

The hole current density becomes higher when the aspect ratio is made higher by narrowing the mesa width (the width of the n-type region 23a sandwiched between the trenches 31) with the depth remaining constant, while a hole current path becomes longer when the aspect ratio is made higher by widening the n-type region 23a in the substrate width direction, and in either case, the voltage drop caused by the hole current becomes higher. For example, the kind of IGBT structure with a narrow mesa width (IEGT structure) shown in the fragmentary perspective view of the surface cell of the trench gate type IGBT of FIG. 4 is such that the surface carrier concentration improves remarkably owing to the previously described IE effect. The IE effect, being a phenomenon arising from the geometrical shape of the mesa region, is an effect which does not exist in the planar gate type IGBT. However, when positively using the IE effect in a trench gate type IGBT having an n mesa structure with a high aspect ratio, there arises a manufacturing problem that it is not easy to form a deep trench and a narrow mesa width, but furthermore, there are also characteristics problems to be described hereafter.

In a turn-on period in which the IGBT makes a transition from a steady off-state to an on-state by giving the gate a gate voltage pulse equal to or higher than a threshold level, holes injected from a backside pn junction (a collector junction) follow the path of passing through a surface p base region and being drawn out from an emitter electrode. Meanwhile, it is often the case that the trench gate type IGBT uses an electrically floating p layer (a floating p layer 32) in order to secure withstand voltage, as shown in the sectional view of FIG. 5. Early in the turn-on period, high voltage is applied between the collector and emitter, and a depletion layer extends from the pn junction between the surface p base region 30 and n drift layer 23, forming a space charge region across the junction. The floating p layer 32 is spaced a certain distance from the p base region 30, and the potential of the floating p layer 32 is higher than the emitter potential. As the potential of the floating p layer 32 is naturally lower than the collector potential, hole current coming from the backside flows into the floating p layer 32. The potential of the n drift layer 23 surface in contact with a trench gate insulator 34 is also higher than the emitter potential, and a hole inversion layer is formed. A condition in which a certain current is flowing is taken to be a steady condition "A". When the gate voltage rises slightly with respect to the steady condition A, electron current flowing out from a surface channel increases, and consequently, a condition in which hole current from the backside has also increased is taken to be a steady condition "B". Hole current flowing into the floating p layer 32 has increased more in the condition B than in the condition A, and in order to maintain the steady condition, it is necessary to increase hole current flowing out into the emitter electrode 33 from the p base region 30 by way of the hole inversion layer by the potential of the floating p layer 32 rising, and at the same time, to suppress the amount of hole current intruding into the floating p layer 32. This is because otherwise there is an excess of hole current intruding into the floating p layer 32, and the steady condition cannot be maintained. That is, the potential of the floating p layer 32 rises as hole current increases. In this way, in a turn-on transient condition, the potential of the floating p layer 32 rises along with a rise in collector current, displacement current flows into a gate circuit via the gate insulator 34, thus causing voltage drop in the gate resistance, and raising the gate potential. When observing from outside the device, it appears that current flows out from the gate electrode 28 although the gate voltage is being raised, and it appears as though gate-emitter capacitance is of a negative value. This phenomenon seen as the negative capacitance of the gate is a phenomenon unique to an IGBT having both a MOS structure and bipolar transistor structure. The higher the density of hole current flowing into the floating p layer 32, the higher the rise of potential of the floating p layer 32, and the greater the rising of the gate potential.

Consequently, the trench gate type IGBT of a structure wherein the mesa width is narrow and the area ratio of the p base region 30 is low is such that the previously described IE effect owing to an increase in surface carrier concentration is remarkable, but as much of hole current flows into the floating p layer 32, the rise of potential of the floating p layer 32 is high. When the gate potential rises in the turn-on transient condition, collector current becomes still larger, thus forming a positive feedback loop which further raises the gate voltage. This causes a problem that the rate of rise of current at turn-on time becomes extremely high. Also, as voltage drop in the gate resistance caused by the displacement current becomes higher even though the gate resistance is made higher by attempting to slow a turn-on behavior, it is not possible to suppress the rate of rise of collector current at turn-on time. This phenomenon is brought out even though the voltage between the collector electrode 27 and gate electrode 28 hardly fluctuates and has no direct relationship to the collector-gate capacitance. However, a structure with high collector-gate capacitance is often such that the rising of the gate potential by a rise in collector current is high.

FIG. 6 shows a waveform diagram of collector current and gate voltage at turn-on time in a trench gate type IGBT using the heretofore known floating p layer 32 previously described. At turn-on time, the collector current exhibits a peak current waveform protruding far out. In this way, when a rise in collector current cannot be controlled by the gate resistance, as well as the rate of decrease of the voltage between the collector and emitter of the IGBT after the collector current has reached a predetermined value becoming higher, the rate of rise of reverse voltage (dV/dt) at the time of reverse recovery action of reflux diode of the opposing arm in the inverter circuit increases, thus leading to a problem that radiation noise increases.

This will be described as follows using the chopper circuit of FIG. 7. That is, assuming that current flowing to load inductance is constant, the rate of rise of the collector current of the IGBT and the rate of decrease of the current of the previously described reflux diode are equal. When the current direction of the reflux diode changes from the forward direction to the reverse direction in the IGBT turn-on period, reverse voltage is soon applied to the reflux diode. The higher the rate of decrease of current at this point, the more quickly the reverse voltage of the diode rises, because of which it is necessary to promptly discharge the accumulated charge in the diode to the exterior in order to maintain the rate of decrease of the reflux diode current already flowing in the reverse direction. Because of this, the rate of rise of the diode reverse voltage increases, and the previously described noise is generated, as a result of which the rate of decrease of the voltage between the collector and emitter of the IGBT increases.

FIG. 8 shows a waveform diagram of collector voltage and reflux diode reverse voltage at turn-on time in the heretofore known trench gate type IGBT. A further detailed description will hereafter be given of a mechanism wherein the rate of decrease of the current of the reflux diode affects the rate of rise of the reverse voltage of the diode. A chopper circuit wherein there exists no parasitic inductance of the main circuit is considered for the sake of ease. In the same way as described earlier, it can be deemed that the current flowing through the load inductance is constant in a switching period. Collector current rises as the gate voltage of the IGBT rises. At the same time, the forward current of the reflux diode continues to decrease, and eventually, flows in the reverse direction. This is because excess carriers inside the diode flow out toward each electrode. At this time, the forward voltage of the IGBT is substantially equal to bus voltage, and the space charge region is expanding inside the IGBT. The gate current of the IGBT continues to rise toward a predetermined voltage (for example, a gate threshold voltage of 15V), and the collector current overshoots the forward current of the diode immediately before turn-on. This is because the collector voltage is very high compared with in the IGBT steady on-state. This amount of overshoot current is made up for by reverse current swept out from the diode, but when it is difficult to supply the reverse current, reverse voltage is applied to the diode, and the IGBT collector voltage starts to decrease compared with the bus voltage. The depletion layer develops inside the diode owing to the reverse voltage of the diode, thus promoting the sweeping out of carriers, and supplying reverse current. The reverse voltage of the diode rises so that it is possible to continuously satisfy the rate of rise of collector current at the time when the voltage applied to the diode changes from the forward direction to the reverse direction. In the event that the rise in the reverse voltage of the diode is insufficient, it is not possible to supply current necessary as collector current determined by the gate voltage and collector voltage of the IGBT at that moment, and it is attempted to supply current from a power source through the load inductance. That is, an induced electromotive force occurs in the load inductance, and the potential of the IGBT collector lowers. That is, the reverse voltage of the diode rises. By this kind of circuit action, the reverse voltage of the diode rises so that the rate of rise of collector current at this time is maintained as it is. In other words, the rate of rise of collector current at the point at which the reverse voltage starts to be applied to the diode determines the rate of rise of the reverse voltage of the diode.

Meanwhile, as shown in the waveform diagram of the trench gate type IGBT and reflux diode all over the turn-on period of FIG. 9, the characteristics of the diode affect the rate of rise of the diode reverse voltage. In a diode forward current-carrying condition, in the event that there are many anode-side accumulated carriers, many carriers can be swept out by a lower rate of rise of reverse voltage, and consequently, the rate of rise of reverse voltage becomes lower. However, this kind of diode with a large number of anode-side accumulated carriers is not preferable because as the reverse recovery peak current is large, the reverse recovery characteristics are hard, and high spike voltage is generated. Assuming that no parasitic inductance component exists, the sum of the diode reverse voltage and IGBT collector voltage is the bus voltage, meaning that as the diode reverse voltage rises, the IGBT collector voltage decreases in a mirror image manner. As the collector voltage continues to decrease, the bias conditions of the IGBT change, the rate of rise of collector current becomes dull, and consequently, the rate of increase of the reverse current of the diode also becomes dull. Eventually, the collector current shifts to a decrease. This time is also the moment the reverse recovery current of reflux diode of the opposing arm reaches its peak. The period of rising of the gate voltage by the positive feedback loop also finishes, and the gate voltage also decreases slightly as the collector current starts to decrease. The collector current asymptotically approaches its proper current value at which it has originally been flowing through the reflux diode, and the reverse current of the reflux diode asymptotically approaches zero. While the gate voltage is maintaining a value slightly higher than the threshold value according to the Miller capacitance effect, the collector voltage continues to decrease.

To describe the Miller capacitance, this is a phenomenon wherein by the collector voltage decreasing, the displacement current passing through the collector-gate capacitance flows into the gate of the device from the gate circuit, and the gate potential is held down by the voltage drop of the gate resistance. Because of this, the gate voltage is maintained at substantially a constant value, and when seeing from an external circuit, it appears that the input capacitance of the IGBT has become very high. In the event that the gate voltage rises in a Miller capacitance period, the collector current increases, and voltage in a direction in which an increase in current is suppressed by the load inductance is generated, meaning that the collector voltage decreases, and the gate voltage lowers owing to the displacement current passing through the collector-gate capacitance. Conversely, assuming that the gate voltage has decreased, a mechanism wherein the gate voltage rises owing to an inverted behavior functions. In this way, a negative feedback loop undergoing a collector voltage change functions in the Miller capacitance period. The conductivity modulation inside the IGBT progresses sufficiently, and when the collector voltage lowers and approaches a certain value, the negative feedback loop vanishes, and the gate voltage rises toward a gate supply voltage, and eventually reaches the steady on-state.

As above, in the first half of the turn-on of the trench gate type IGBT having the n mesa structure with high aspect ratio, the rate of rise of collector current is affected by the positive feedback loop. The rate of rise of collector current is determined by various factors such as the gate resistance, the surface structure including the presence or absence of the floating p layer, and the parasitic inductance. The collector-gate capacitance itself is not a decisive factor. The reason is that even in the event that no parasitic inductance exists, and the collector voltage is not changed by a rise in the collector current (that is, even in the event that there is little displacement current via the collector-gate capacitance), the rate of rise of collector current is determined by the effect of the positive feedback loop.

Meanwhile, in the second half of the turn-on of the trench gate type IGBT having the n mesa structure with high aspect ratio, the rate of decrease of collector voltage is affected by the negative feedback loop. The gate resistance and collector-gate capacitance (feedback capacitance) are decisive factors of the rate of decrease of collector voltage. The lower the collector-gate capacitance, the higher the rate of decrease of collector voltage. When the collector-gate overlapping area is large, the rate of decrease of collector voltage is likely to be affected by the positive feedback loop in the first half of the IGBT turn-on, and as the collector-gate capacitance is high, the rate of decrease of collector voltage is likely to be affected by the negative feedback loop in the second half of the IGBT turn-on. Consequently, as the rate of rise of turn-on current is high, and the rate of decrease of turn-on voltage is low, there is a tendency for both noise and loss to become higher. However, as the collector-gate capacitance is not necessarily the decisive factor of the positive feedback loop, an IGBT structure with a low rate of rise of turn-on current exists even though the collector-gate capacitance is high. When the collector-gate capacitance is extremely low, the rate of rise of collector voltage at turn-on time is high, and this becomes a main source of radiation noise. Unlike at turn-on time, the collector-gate capacitance is a decisive factor for the rate of change of voltage at turn-off time.

According to the above discussion, with the trench gate type IGBT including the n-type mesa structure with high aspect ratio and the floating p layer, when the area ratio of the p base region is lowered in order to increase the surface carrier concentration of the IGBT for the purpose of improving the previously described trade-off relationship, an increase in radiation noise at turn-on time becomes a problem. That is, the trade-off relationship exists between the generated noise and on voltage at turn-on time too.

It is often the case that the rate of rise of reverse voltage of the reflux diode particularly at low temperature time and low current time is a decisive factor of noise. According to a further analysis, the shape of the floating p layer also affects the rate of rise of current at turn-on time. This mechanism is slightly complex. FIGS. 10 and 11 are respectively a cell sectional view of a trench gate type IGBT having the floating p layer 32 and an enlarged cell section view showing equipotential lines around the floating p layer 32 when high voltage is applied to the collector, and show how the shape of the equipotential lines is distorted. Consequently, at turn-on time, it is easy for hole current to enter the floating p layer 32 in accordance with the potential gradient, and the rise of potential of the floating p layer 32 becomes higher. Because of this, displacement current flowing into the gate electrode 28 via the gate insulator 34 from the floating p layer 32 increases.

On one hand, in a manufacturing process, when a structure is adopted wherein the depth of the floating p layer exceeds the trench 31 bottom portion, as shown in FIG. 12, as well as the distance between the floating p layer 32 and p base region 30 being shortened, as the gate insulator 34 is thick, the trench 31 bottom portion with high hole inversion layer resistance becomes a highly concentrated p-type region, and it is possible to lower the resistance between the floating p layer 32 and p base region 30. As a result of this, it is possible to secure the controllability of the rate of rise of collector current by the gate resistance at turn-on time. This structure is a method of coping with the idea of making it easy for hole current to flow more into the floating p layer 32, but also making it easy to discharge the hole current.

On the other hand, in the kind of structure shown in FIG. 10 wherein the depth of the floating p layer 32 does not exceed the trench 31 bottom portion, as the distance between the floating p layer 32 and p base region 30 is not shortened, resistance increases, and the potential of the floating p layer 32 is likely to rise, meaning that the rate of rise of current at turn-on time is high. In any case, a design to sufficiently widen the mesa width and suppress hole current constriction, that is, to sacrifice the IE effect to some extent is essential.

In a structure wherein the depth of the floating p layer 32 is shallower than the trench 31 depth, as shown in FIG. 13, the previously described kind of hole current collection effect decreases, while an increase in electrical resistance by an increase in the distance between the floating p layer 32 and p base region 30 can be seen. Consequently, an effect on the turn-on characteristics is determined by the size of the two mutually opposing effects.

As the high voltage IGBT for solving the heretofore described problem that the rate of rise of turn-on current becomes higher, IGBTs of structures described hereafter are known [Japanese Patent No. 4,205,128 (claim 1 and paragraphs 00047 to 00050), JP-A-2010-141310 (claim 1 and paragraph 0006), and JP-A-2011-176249 (claim 1 and paragraph 0013)]. For example, an IGBT includes in a semiconductor substrate surface a plurality of gate trenches each having a gate insulator formed so as to cover the inner surface of a first trench and a conductor gate electrode filling the first trench. The IGBT includes a second trench in a position in the substrate surface sandwiched between the plurality of gate trenches, and includes in the second trench an emitter trench, electrically connected to the insulator and an emitter electrode, which is filled with a second electrode with the same potential [Japanese Patent No. 4,205,128 (claim 1 and paragraphs 00047 to 00050)].

Also, as another IGBT, there is proposed an IGBT which includes in the surface of an n-type semiconductor substrate a plurality of parallel trenches and a protruding semiconductor region, narrower in width than the trenches, between the parallel trenches, includes in the protruding semiconductor region a p-type base region and an n$^+$emitter region on the surface side of the p-type base region, and includes a gate electrode, across a gate insulator, in the sidewall of the protruding semiconductor region [JP-A-2010-141310 (claim 1 and paragraph 0006)].

Furthermore, as another IGBT, in another patent document there is proposed an IGBT which includes, in an active region, through which main current flows, on one principal surface side of an n-type silicon semiconductor substrate, a ring-shaped protruding semiconductor region having a circle or oval ring-shaped surface and a layer with an n-type emitter region and p-type base region stacked therein from the ring-shaped surface side toward a lower layer, with a position corresponding to each of the intersections of grid-like line patterns perpendicular to each other at a predetermined pitch as the center. The IGBT, being such that the protruding semiconductor region is disposed so as to have a size with an area ratio of 50% or less of a region enclosed by the perpendicular grid-like line patterns, and a depression reaching a position deeper than the p-type base region is provided in a region in the active region other than the protruding semiconductor region, includes a gate electrode, across a gate insulator, in a sidewall of the depression on the peripheral side of the protruding semiconductor region [JP-A-2011-176249 (claim 1 and paragraph 0013)].

However, it is described in the previously described Japanese Patent No. 4,205,128 that it is possible, with the IGBT thereof, to suppress the rate of rise of turn-on current by using a trench gate structure with emitter potential. This is because a change in the potential of a floating p layer has no direct effect on a gate electrode. Also, the hole inversion strength of the sidewall of an emitter trench is greater than that of the sidewall of a gate trench, and the electrical resistance between the floating p layer and a p base region is low. This is because the potential in the emitter trench is lower than the potential in the gate trench. Consequently, the rise of potential of the floating p layer itself is also low. Because of this, it does not happen that the rate of rise of current at turn-on time rises immoderately. However, with this structure, the p base region exists on each side of the gate trench, meaning that there is a problem that the area ratio per unit cell of the p base region is twice as high as that in a normal trench gate structure with the same trench pitch.

Meanwhile, in a planar gate structure without using the floating p layer too, there exists a problem of the rising of gate potential by negative gate capacitance. Hole current and electron current flowing through a space charge region at turn-on time are such that as the velocity of carriers is infinite, the carriers themselves causes a change in space charge density. In a planar gate type IGBT, electron current flows so as to expand from the terminating portion of an electron accumulation layer 21 toward a bulk portion, as shown in FIGS. 14A and 14B. Because of this, electron current density is low in a position remote from the n channel (inversion layer 20). Meanwhile, hole current flows substantially uniformly from the backside (a collector layer) toward the surface, and hole current density is also sufficiently high in the position remote from the n channel (inversion layer 20). Consequently, there are excess electrons in the vicinity of the n channel (inversion layer 20), while there are excess holes in the position remote from the n channel (inversion layer 20), a lateral electric field is generated, and the silicon potential in the position remote from the n channel (inversion layer 20) rises. The rise of potential of a silicon surface generates current flowing around into a gate circuit via a gate insulator immediately above the silicon surface, thus raising the rate of rise of turn-on current. As the silicon surface potential is likely to rise in the position distant from the n channel (inversion layer 20), it is possible to suppress gate displacement current by eliminating a gate electrode in the position distant from the n channel (inversion layer 20) or increasing the thickness of the gate insulator in this position (a terrace gate structure).

In the planar gate type IGBT too, when the area ratio of the p base region is reduced, hole current density per unit cell increases, and the rise of silicon surface potential increases, thus causing a problem that current flowing around into the gate circuit via the gate insulator immediately above the silicon surface is caused to occur, thus raising the rate of rise of turn-on current.

With regard to a trench gate type IGBT without using a floating p layer too, when a structure is adopted wherein, for example, the area ratio of a p base region is reduced, the trench width is widened, the gate width is widened, and the aspect ratio of an n-type mesa region is increased, thus forming a vertically long structure, the potential of a silicon surface in contact with a gate insulator is likely to rise owing to a rise in hole current density, and there arises a problem that current flowing around into the gate circuit becomes larger, thus raising the rate of rise of turn-on current, in the same way as previously described.

SUMMARY

Embodiments of the invention, having been contrived in order to solve the heretofore described problems, have an object of providing a MOS type semiconductor device wherein on voltage is low, the rate of rise of current at turn-on time is low, and it is possible to hold down the rate of rise of collector current at turn-on time, and thus reduce radiation noise.

In order to solve the problems and achieve the object, one aspect of the invention provides a MOS type semiconductor device including a stripe-shaped plan-view pattern of protruding semiconductor region on one principal surface of a first conductivity type semiconductor substrate, the protruding semiconductor region having a second conductivity type region sandwiched between an upper side first conductivity type first region and a lower side first conductivity type second region, a top flat portion including a depression region with a depth reaching the second conductivity type region from the surface of the upper side first conductivity type first region, and an inclined portion between the top flat portion and a bottom flat portion around the protruding semiconductor region; and a gate electrode covering a surface of the inclined portion of the second conductivity type region across a gate insulator, wherein one end portion of the gate electrode is on a surface within the inclined portion, and the other end portion is on a surface of the lower side first conductivity type second region on the side of and in the vicinity of the second conductivity type region. It is preferable that the other end portion covers the surface of the lower side first conductivity type second region across the gate insulator by a distance of 5 μm or less from the second conductivity type region. It is desirable that the MOS type semiconductor device further includes a first metal main electrode across an interlayer insulator on the gate electrode, wherein the first metal main electrode is in common conductive contact, through a contact hole provided in the interlayer insulator, with a first conductivity type first region surface exposed in the depression region on the top flat portion and a second conductivity type contact region surface inserted from the contact hole. Also, it is also good that the lower side first conductivity type second region is the first conductivity type semiconductor substrate or a region higher in impurity concentration than the first conductivity type semiconductor substrate. Furthermore, it is also preferable that the MOS type semiconductor device is an IGBT.

Also, to give a specific description with the MOS type semiconductor device of embodiments of the invention limited to an IGBT, by adopting an IGBT including the kind of protruding-type emitter structure (protruding semiconductor region) shown in FIG. 1, it is possible to suppress the lateral diffusion of a p base region compared with a normal planar gate type IGBT, and thus possible to lower the area ratio per unit cell of the p base region. Because of this, it is possible to increase the carrier concentration in the vicinity of the surface of a drift layer, and thus possible to realize surface carrier concentration equivalent to that of a heretofore known trench gate structure. Also, as it is possible to obtain sufficient withstand voltage even without using a floating p layer as in a trench gate IGBT, it is possible, by selecting an optimum cell pitch, to suppress current flowing around into a gate circuit in a turn-on transient condition, suppress the rate of rise of turn-on current, and suppress generation of noise. Furthermore, according to the protruding-type emitter structure relating to the IGBT of embodiments of the invention shown in FIG. 1, by adopting a structure wherein the gate electrode is terminated on a sidewall inclined surface instead of terminating the gate electrode on the top flat portion of the protruding-type emitter structure, it is possible to narrow the width of the top flat surface compared with when the gate electrode is terminated on the top flat surface, that is, to narrow the width of the protruding-type emitter structure, and thus possible to lower the area ratio per unit cell of the p base region. Because of this, it is possible to further reduce on voltage. Also, by adopting a structure wherein the gate electrode in a position distant from the channel (the inclined portion of the protruding-type emitter structure) is eliminated, as shown in FIG. 1, it is possible to reduce the area of the gate electrode, and thus possible to reduce displacement current flowing into a gate drive circuit via the gate electrode at turn-on time. Consequently, it is possible to lower voltage drop caused by gate resistance generated by the displacement current, and thus possible to suppress a rise in gate voltage. As a result of this, it is possible to suppress the rate of rise of collector current, and thus possible to reduce radiation noise.

According to embodiments of the invention, it is possible to realize an IGBT wherein the IE effect is great, and on voltage is low. Also, it is possible to provide a MOS type semiconductor device wherein on voltage is low, the rate of rise of collector current at turn-on time is held down, and radiation noise is low.

Additional aspects and/or advantages will be set forth in part in the description which follows and, in part, will be apparent from the description, or may be learned by practice of the invention

BRIEF DESCRIPTION OF THE DRAWINGS

These and/or other aspects and advantages will become apparent and more readily appreciated from the following description of the embodiments, taken in conjunction with the accompanying drawings of which:

FIGS. 3A, 3B, 3C, and 3D are respectively a sectional view showing an impurity concentration distribution in the vicinity of a surface cell for showing how an electron accumulation layer and a drift layer are forward biased, an enlarged sectional view of a substrate surface layer of FIG. 3A, an enlarged sectional view showing an electron carrier concentration distribution, and an enlarged sectional view showing voltage drop caused by hole current using an equipotential line distribution.

FIGS. 16A and 16B are cell sectional views showing a comparison of electron currents in planar gate type IGBTs with different cell pitches.

FIG. 17 is a forward on current—voltage waveform diagram of an IGBT having the protruding-type emitter structure of embodiments of the invention and an IGBT having the heretofore known one.

FIG. 18 is a comparison diagram of a relationship in the rate of rise of diode reverse voltage and turn-on loss between an IGBT having the protruding-type emitter structure of embodiments of the invention and an IGBT having the heretofore known one.

DESCRIPTION OF EMBODIMENTS

Figure 1:
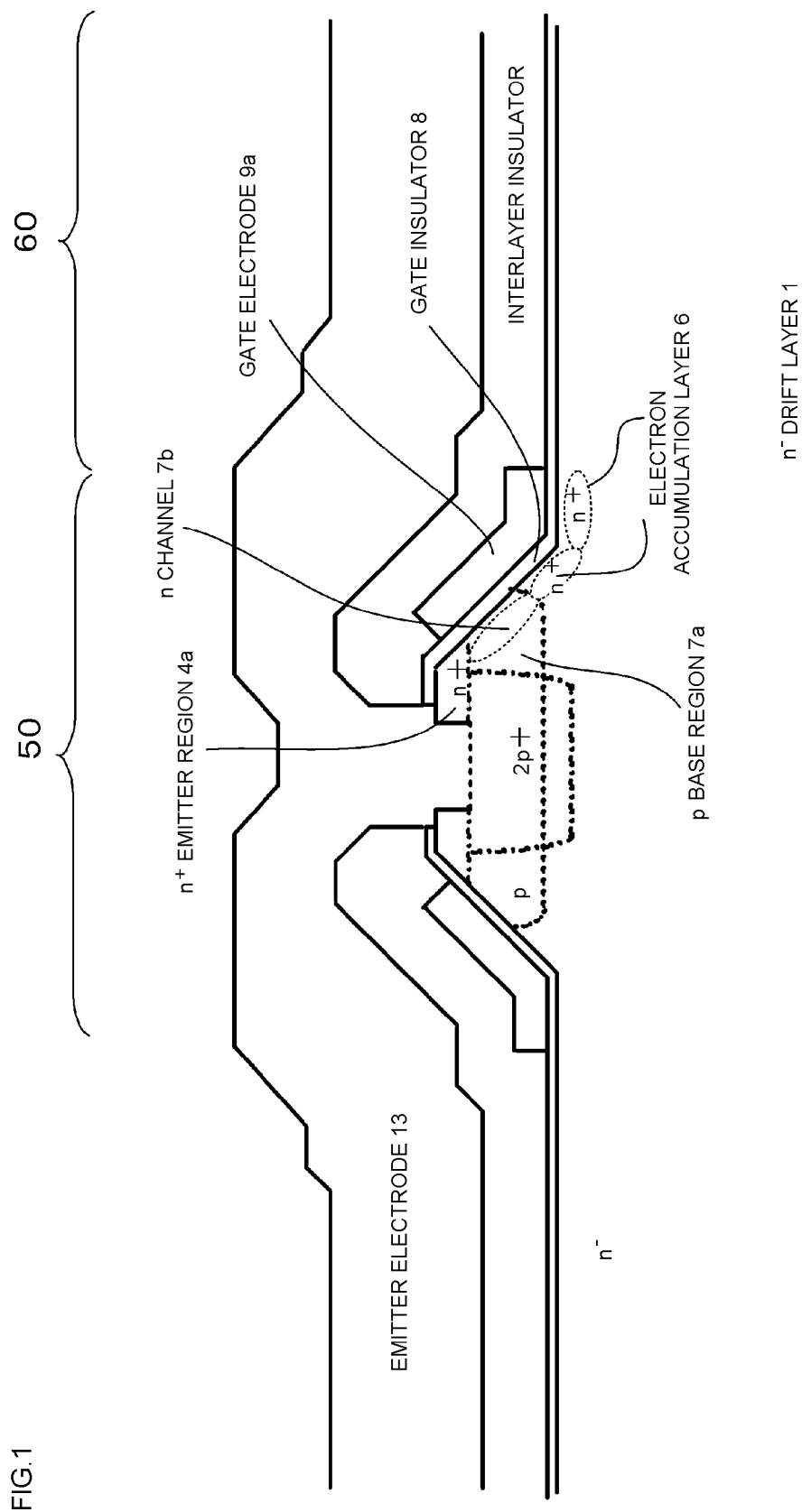
FIG. 1 is a cell sectional view of an IGBT having a protruding-type emitter structure of embodiments of the invention.
Figure 2:
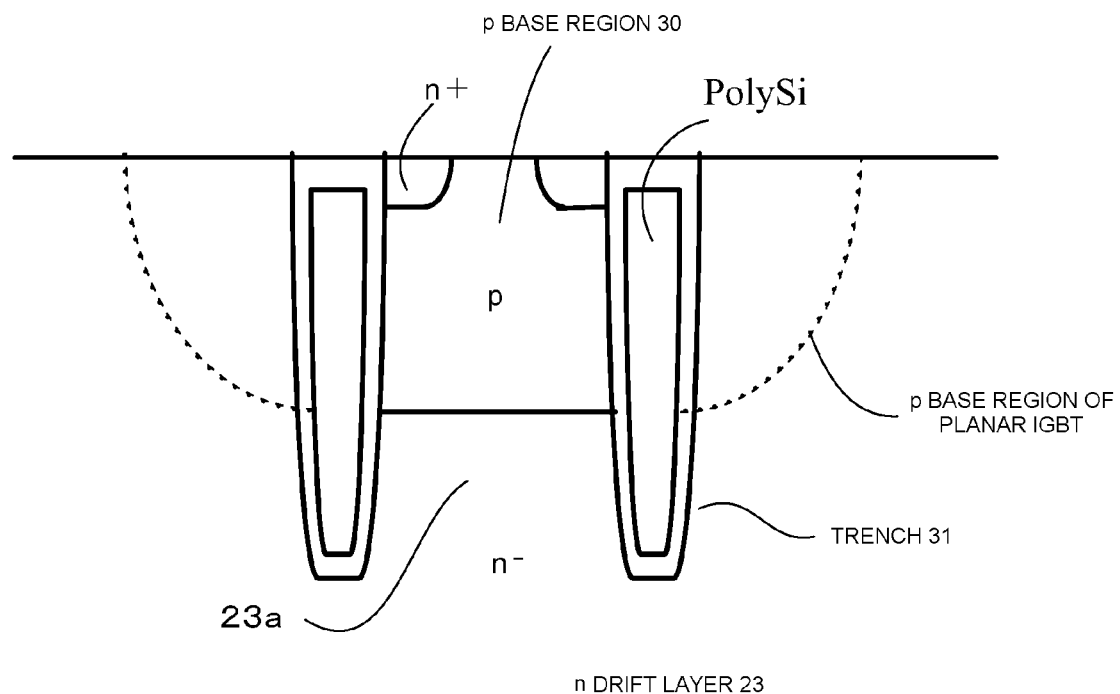
FIG. 2 is a cell sectional view of a heretofore known trench gate type IGBT.
Figure 4:
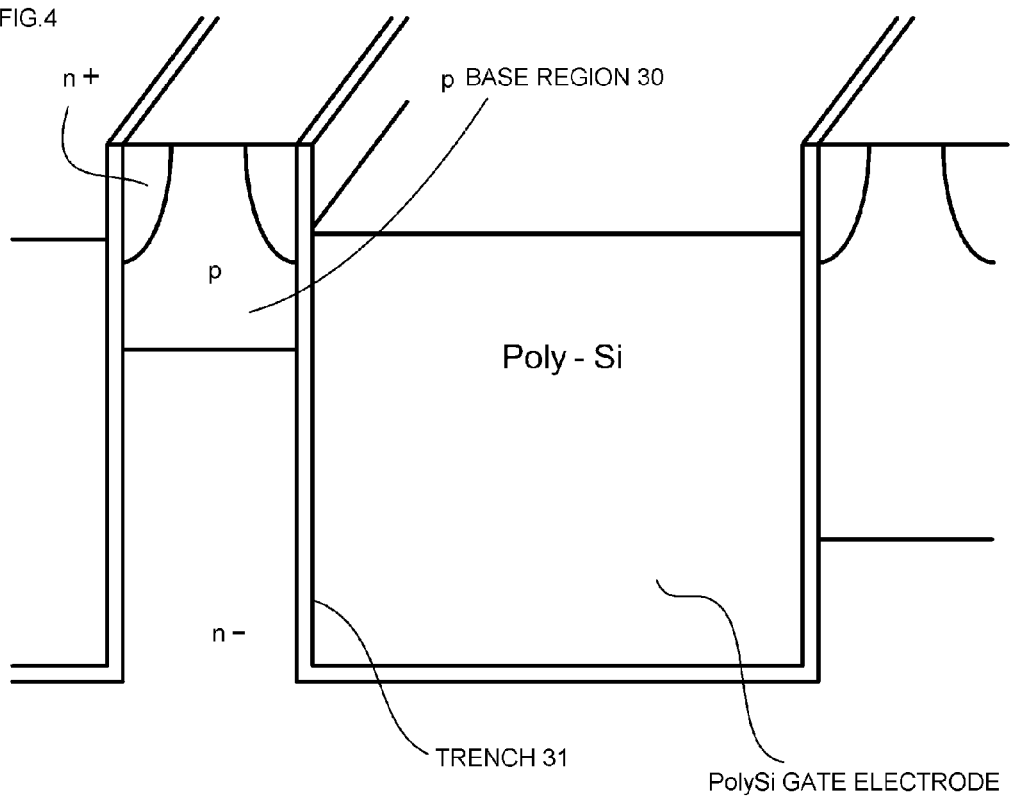
FIG. 4 is a fragmentary perspective view of a surface cell of a heretofore known trench gate type IGBT.
Figure 5:
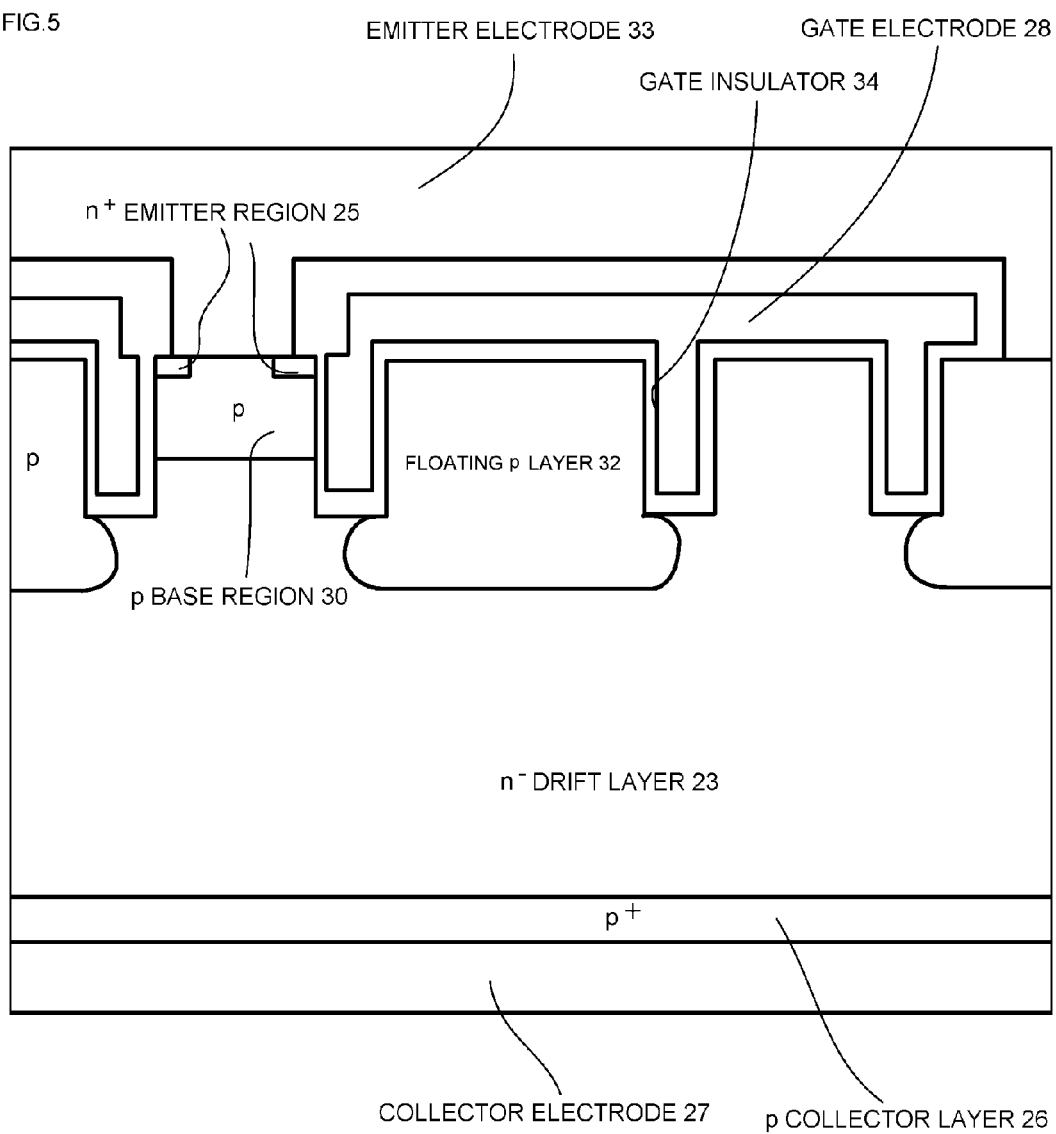
FIG. 5 is a cell sectional view of a heretofore known trench gate type IGBT having a floating p layer.
Figure 6:
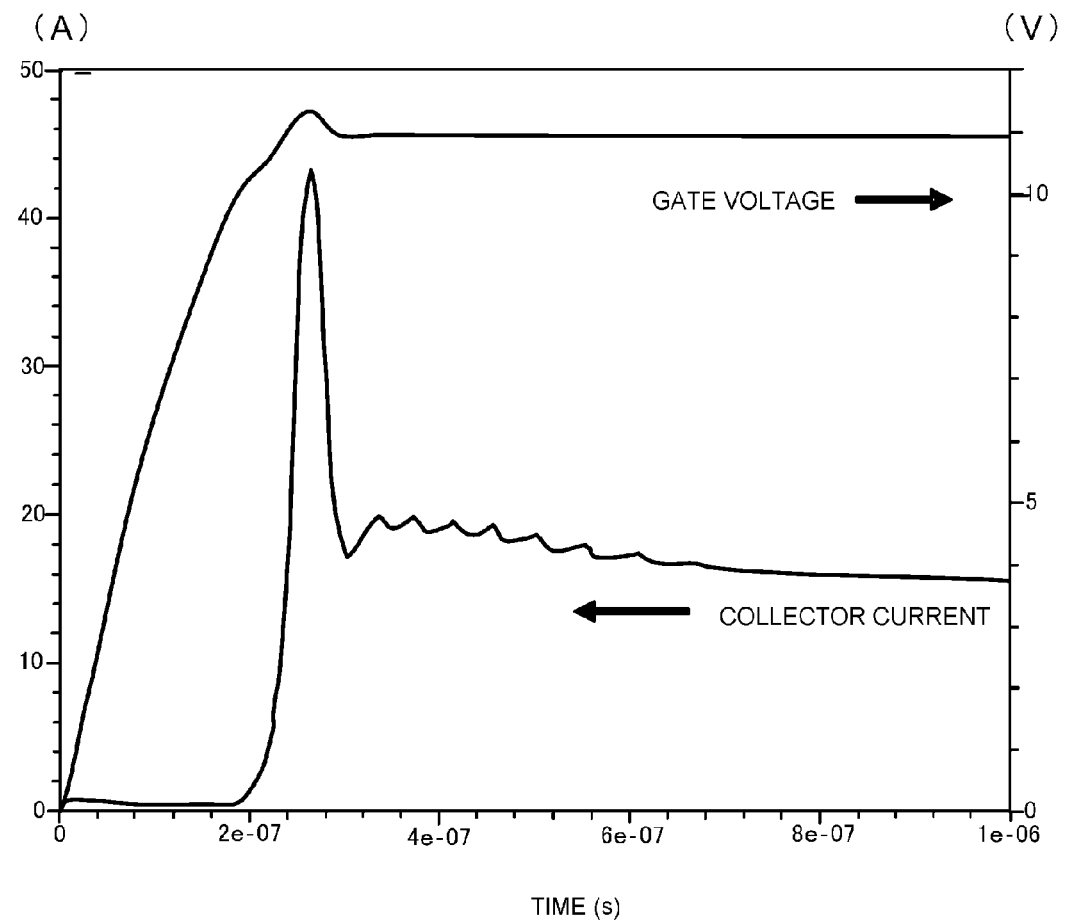
FIG. 6 is a waveform diagram of collector current and gate voltage at turn-on time in the heretofore known trench gate type IGBT.
Figure 7:
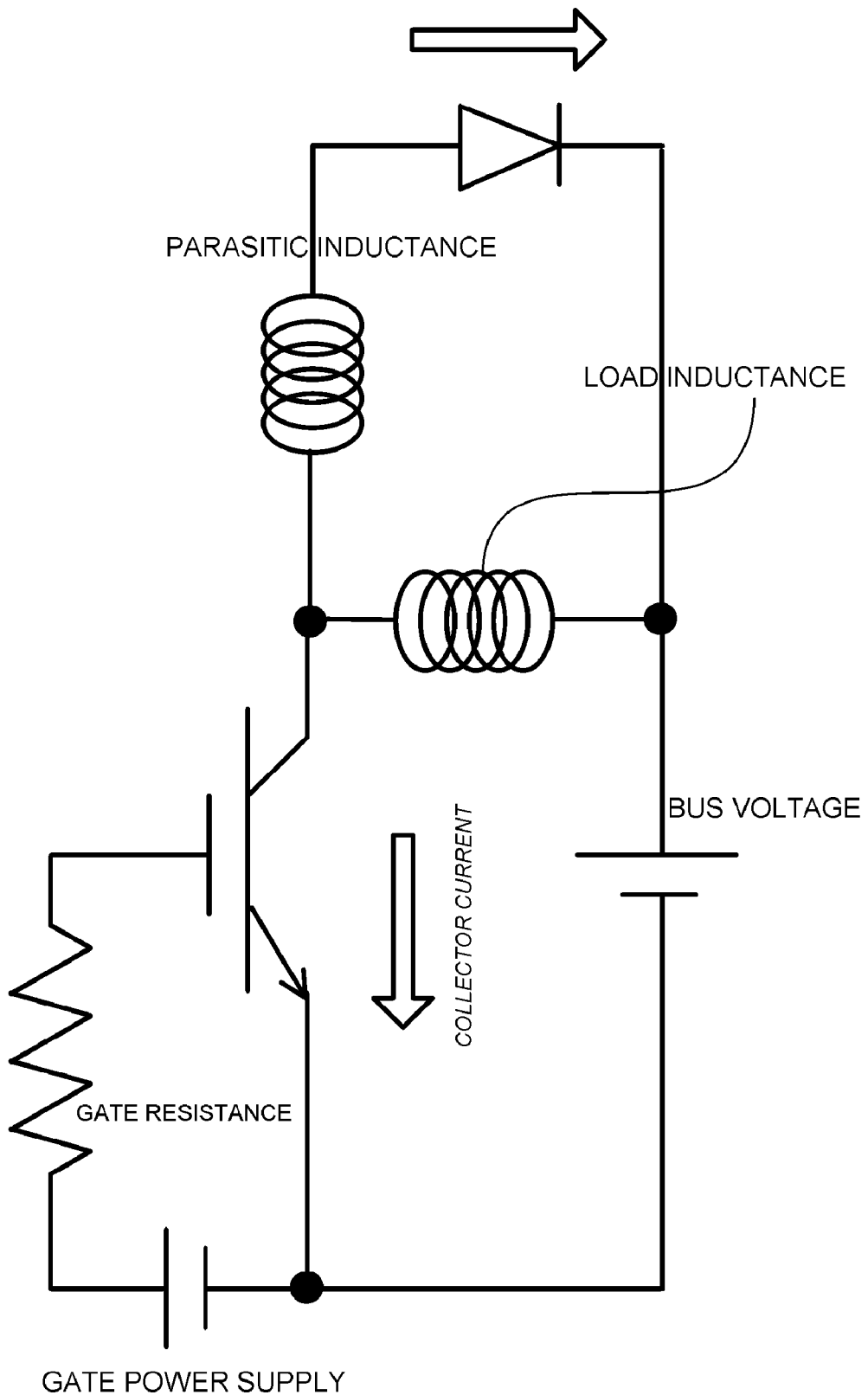
FIG. 7 is a chopper circuit diagram.
Figure 8:
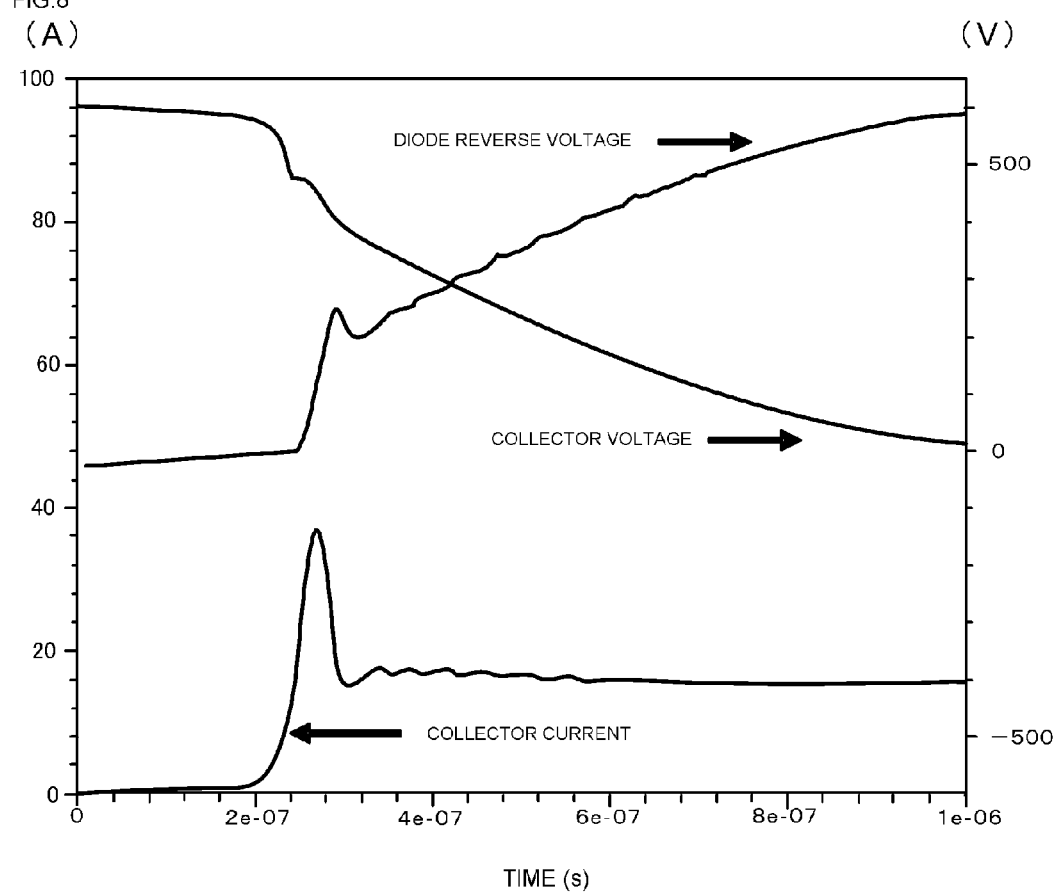
FIG. 8 is a waveform diagram of collector voltage and diode reverse voltage at turn-on time in the heretofore known trench gate type IGBT.
Figure 9:
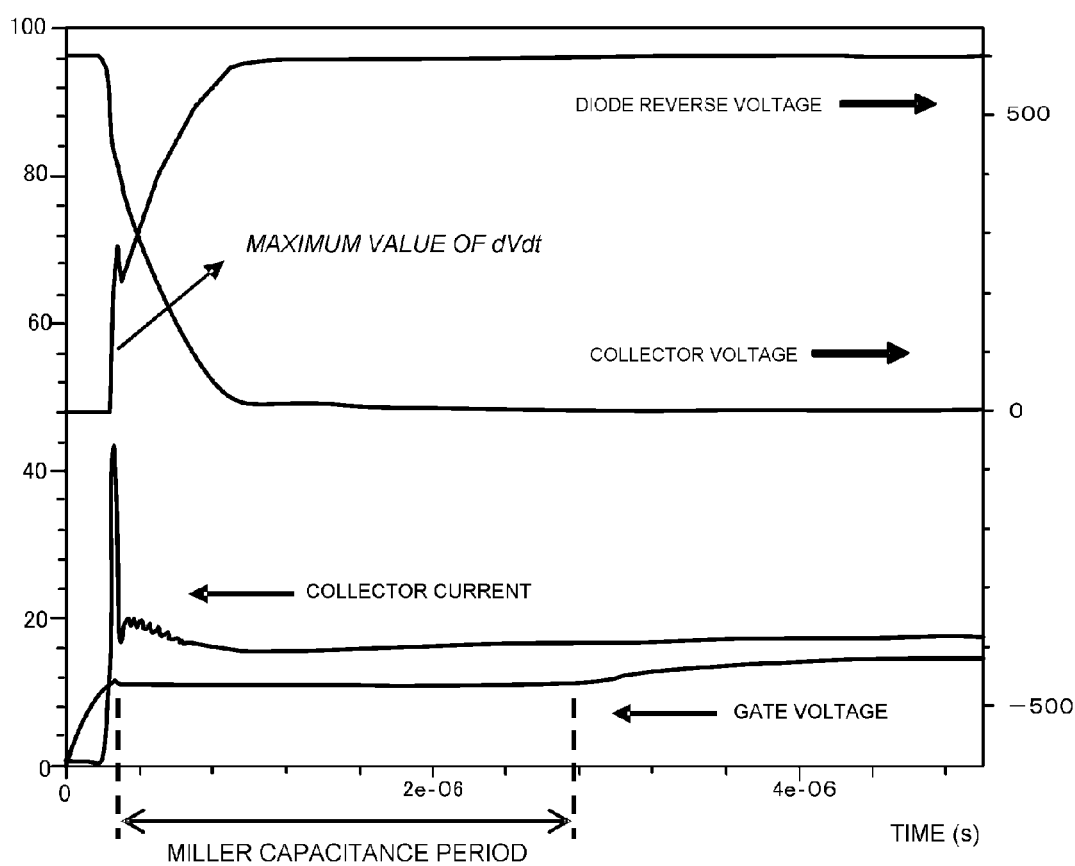
FIG. 9 is a waveform diagram of the trench gate type IGBT and a reflux diode all over a turn-on period.
Figure 10:
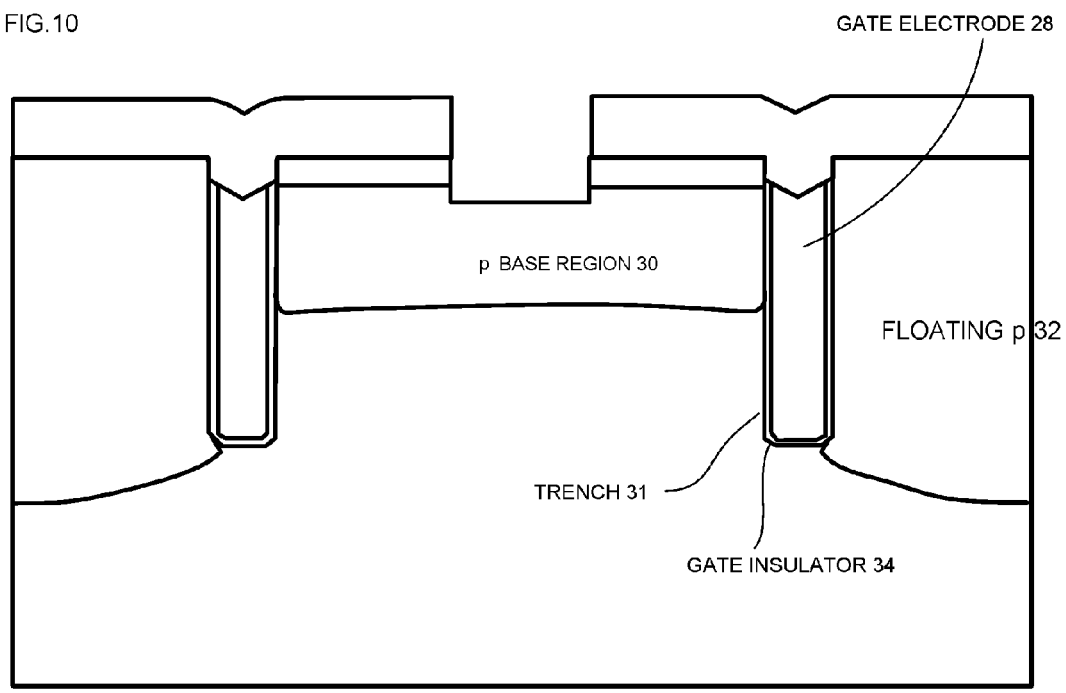
FIG. 10 is a cell sectional view of a trench gate type IGBT having a floating p layer.
Figure 11:
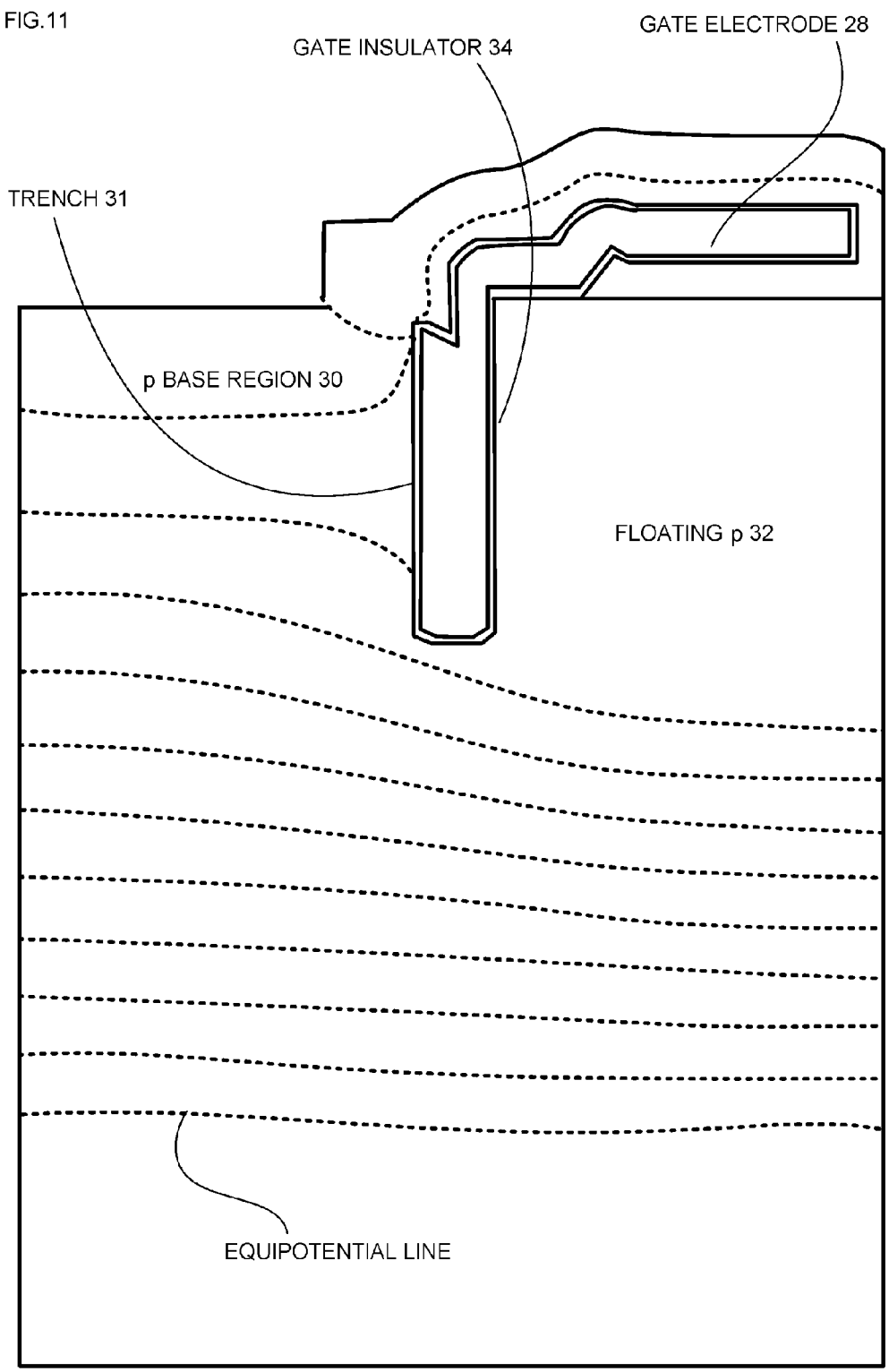
FIG. 11 is a cell sectional view showing equipotential lines around the floating p layer when high voltage is applied to the collector of the trench gate type IGBT having the floating p layer.
Figure 12:
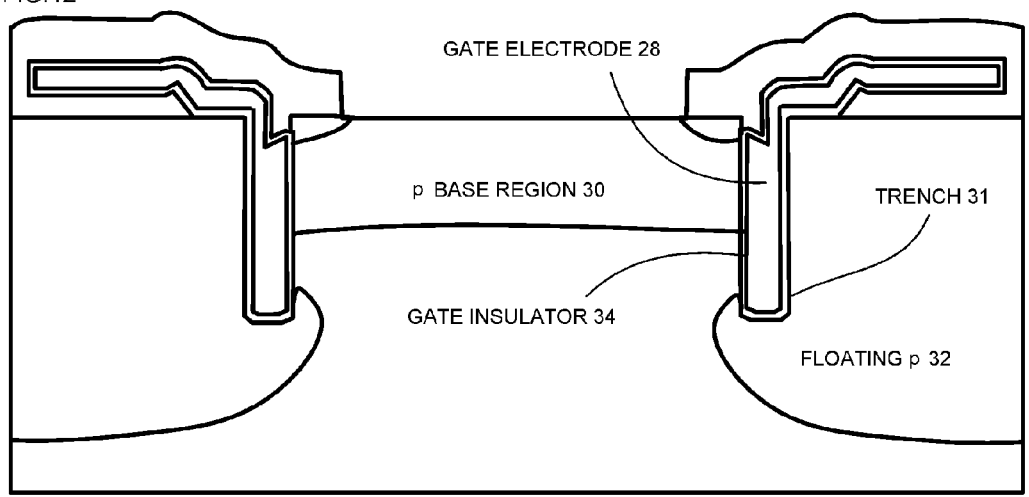
FIG. 12 is a cell sectional view of a trench gate type IGBT having a floating p layer deeper than a trench.
Figure 13:
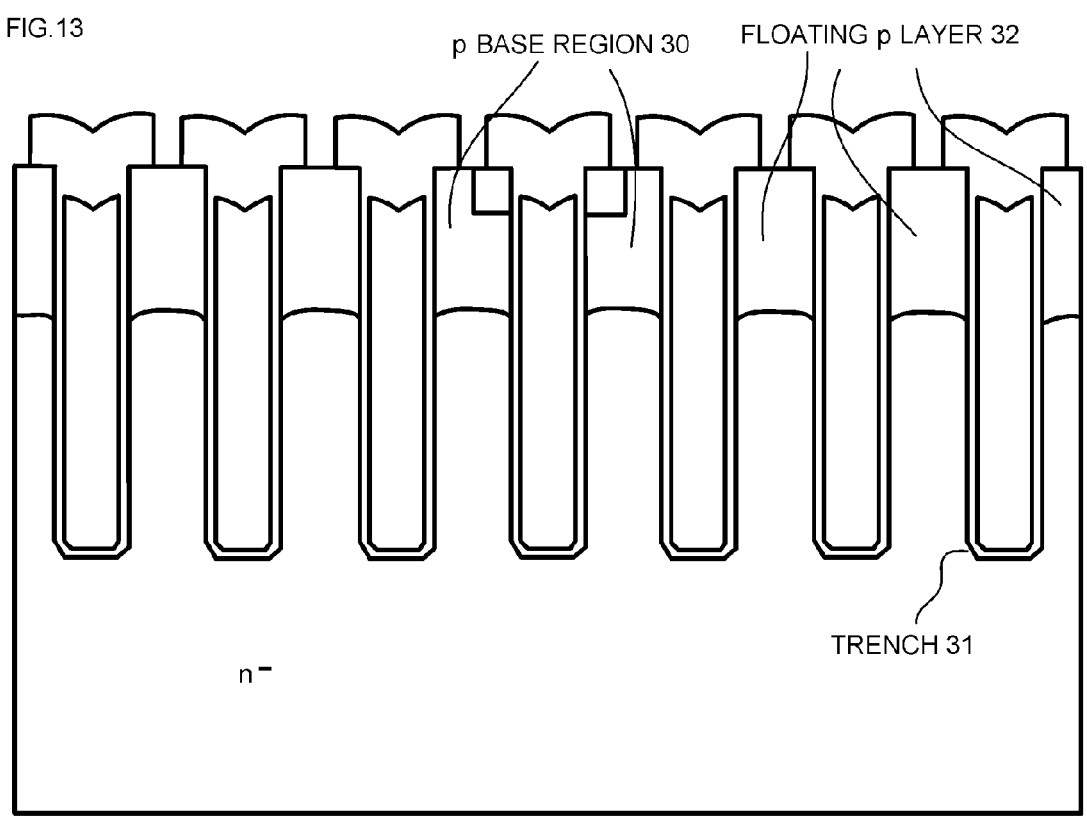
FIG. 13 is a cell sectional view of a trench gate type IGBT having flowing p layers shallower than trenches.
Figure 14A:
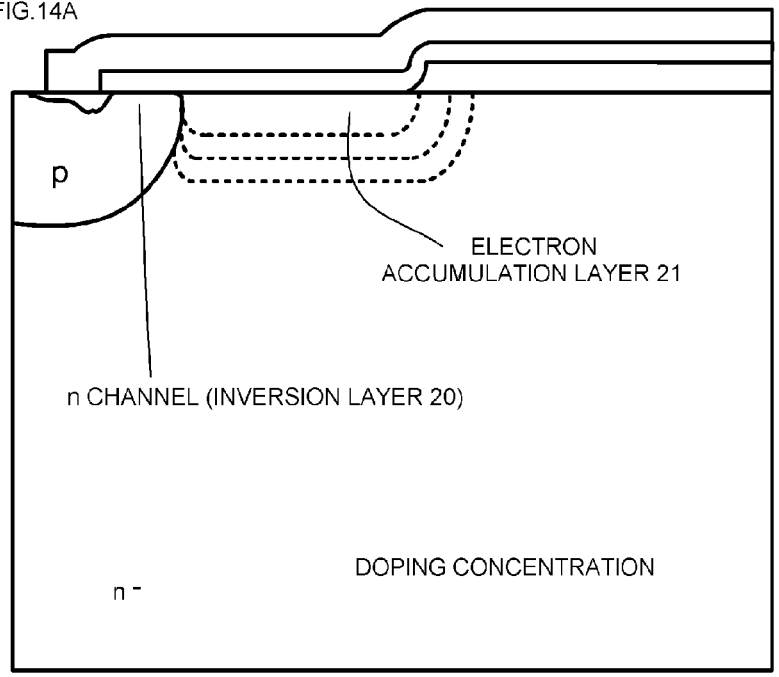
FIGS. 14A and 14B are cell sectional views of an IGBT showing electron current density at turn-on time.
Figure 14B:
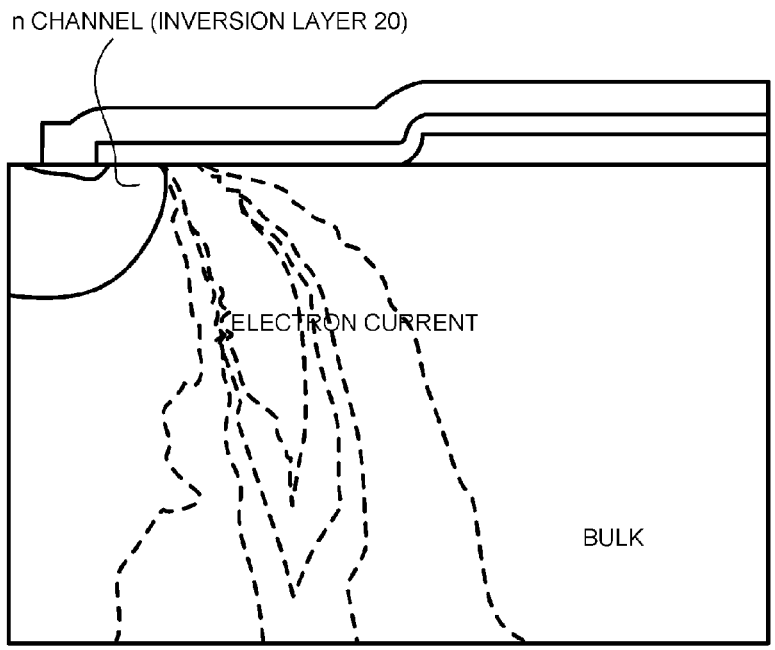
Figure 15:
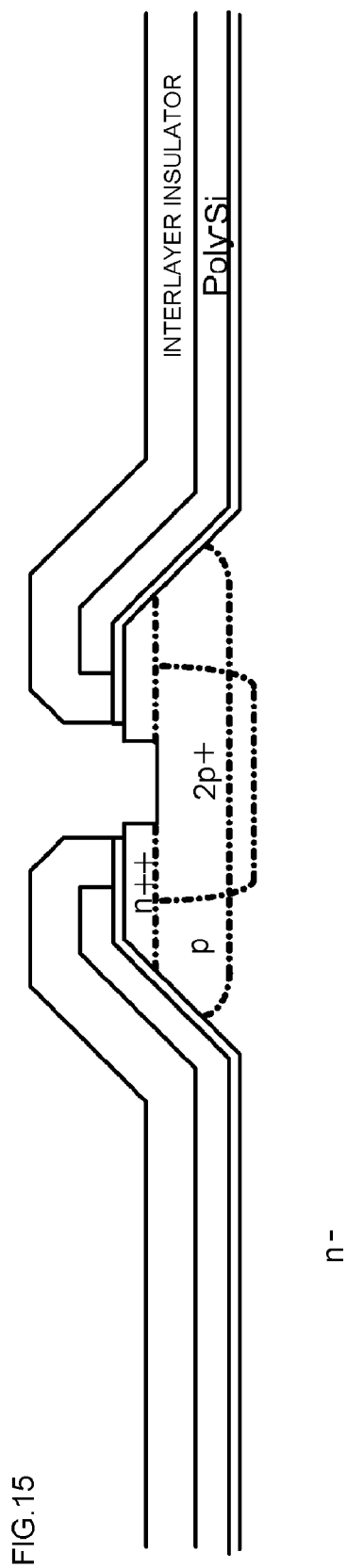
FIG. 15 is a cell sectional view of an IGBT having a heretofore known protruding-type emitter structure.

Hereafter, a detailed description will be given, referring to the drawings, of an exemplary embodiment relating to a MOS type semiconductor device of embodiments of the invention. In this specification and the attached drawings, n or p means that their respective electrons or holes are majority carriers in layers and regions prefixed with n or p. Also, + and − affixed to n and p mean that the respective impurity concentrations of n and p are relatively high and low respectively. Furthermore, in the following description, a case in which an IGBT acts as the MOS type semiconductor device will be described with a first conductivity type as an n-type and a second conductivity type as a p-type. In the following description of the embodiment and the attached drawings, the same components are given identical reference numerals and signs, and a redundant description is omitted. Also, the attached drawings described in the embodiment are not illustrated on an exact scale or at an exact dimensional ratio for ease of visualization and understanding. Furthermore, the invention is not limited to the description of the exemplary embodiment to be described hereafter without departing from the scope of the invention.

Steady On-state

As shown in a surface cell sectional view of an IGBT having a protruding-type emitter structure (which refers to a protruding semiconductor region) of the embodiment of the invention in FIG. 1, when positive gate voltage equal to or higher than threshold voltage relative to an emitter electrode 13 (a first metal main electrode) is applied to a gate electrode 9a, the inclined portion surface of a p base region 7a (a second conductivity type region), which is a sidewall surface of a protruding-type emitter structure 50, is inverted to the n-type (the formation of an n channel 7b). Also, electron accumulation layers 6 are formed on the surface of a silicon substrate 1 (hereafter sometimes referred to as an n⁻drift layer 1, which corresponds to a first conductivity type semiconductor substrate in the claims) of a depression flat portion 60 around the protruding-type emitter structure 50. When forward bias is applied between a collector and an emitter in this condition, electrons flow into the n⁻drift layer 1 by way of the n channel 7b and electron accumulation layers 6. An unshown backside pn junction (collector junction) is forward biased, holes are injected from an unshown p-type collector layer on the backside toward the n⁻ drift layer 1. The holes, on reaching the surface side of the n⁻drift layer 1, flow into the p base region 7a and out to the emitter electrode 13. At this time, hole current flows horizontally below the electron accumulation layers 6 owing to the geometrical shape of the surface. The potential of the n⁻drift layer 1 rises owing to the horizontal voltage drop caused by the horizontal hole current. Meanwhile, as the electron accumulation layers 6 are of low resistance, the potential thereof is substantially equal to the potential of the emitter electrode 13. Consequently, a junction formed of the n⁺electron accumulation layers 6 and n⁻drift layer 1 is forward biased, and electrons are injected from the electron accumulation layers 6 toward the n⁻drift layer 1. The electron concentration on the n⁻drift layer 1 surface increases in proportion to the exponential function of the forward bias. Eventually, the surface electron concentration exceeds the doping concentration of the n⁻drift layer 1 together with the hole concentration, and reaches a high injection condition, and the electrical resistance of the n⁻drift layer 1 lowers dramatically.

A reverse bias condition in which holes flow directly into the p base region 7a, rather than the previously described kind of (n⁺/n⁻) forward bias condition, is reached immediately below the p base region 7a in the protruding-type emitter structure 50 of FIG. 1. Because of this, the carrier concentration immediately below the p base region 7a is extremely low. As the ratio of a low carrier concentration region decreases when the area per unit cell of the p base region 7a is reduced by increasing the pitch of unit cells, average surface carrier concentration rises. Furthermore, by the unit cells having become larger, the total amount of hole current per unit cell increases, and the density of hole current flowing horizontally immediately below the electron accumulation layers 6 increases. Consequently, the forward bias between the electron accumulation layers 6 and n⁻drift layer 1 becomes higher, and the surface carrier concentration rises. Also, as the horizontal length of a hole current path increases, the voltage drop caused by the hole current rises, and the reverse bias becomes higher. As an opposite effect, as a channel perimeter (a channel width) per unit cell decreases, the resistance of an inversion layer (the n channel 7b) and the resistance of the electron accumulation layers 6 increase. Consequently, there exists an optimum cell pitch such that on voltage decreases to the minimum when the size of the protruding-type emitter structure 50 is fixed. When the protruding-type emitter structure 50 is smaller, the cell pitch is shorter, thus reducing the on voltage to the minimum, and the value of the minimum on voltage is low compared with in a structure in which the protruding-type emitter structure 50 is large.

Transition from Forward Blocking State to Steady On-state

When the gate voltage is lower than the threshold voltage, no inversion layer is formed, and no electron current is supplied. When collector potential is made higher than emitter potential in this condition, a depletion layer develops from the pn junction between the p base region 7a and n⁻drift layer 1 toward the backside, and applied voltage is held by an electric field generated in a space charge region in the depletion layer. This condition is a forward blocking state. Herein, when the gate voltage is raised again to the threshold or higher, the inversion layer is formed on the p base region 7a surface, and electron current starts to be supplied. In a condition before the steady on-state is reached, carriers flow into the space charge region. As carrier velocity is finite, carriers themselves become space charge. When there are sufficiently many injected carriers, an originally existing space charge distribution is changed. As electrons flow from the vicinity of the p base region 7a toward the backside, negative space charge increases in this neighborhood. Unlike in the steady on-state, in this condition, the electron concentration decreases promptly with horizontal distance from the p base region 7a. This is because the silicon potential in a position horizontally remote from the p base region 7a is high, and no electron accumulation layer 6 is formed. Meanwhile, holes injected from the backside have a nearly uniform concentration distribution over the horizontal direction. Because of this, positive space charge increases in the position horizontally remote from the p base region 7a. Consequently, in the position horizontally remote from the p base region 7a, the silicon potential rises owing to an electric field generated by the space charge caused by electrons and holes. As the silicon potential below a gate insulator 8 rises, displacement current flows through the gate insulator 8 into a gate resistance outside the device. This current causes voltage drop to occur in the gate resistance, and the gate voltage rises. As a result of this, during a turn-on period, the current originally flows into the IGBT gate from a gate drive circuit, but reverse current flows from the IGBT gate to the gate drive circuit, meaning that the gate voltage becomes higher than the original value owing to the voltage drop in the gate resistance caused by this reverse current component. Because of this, channel inversion becomes stronger, and the electron current and subsequently the hole current increase. As the above phenomenon forms a positive feedback loop, the rise of gate voltage and collector current becomes unignorably higher.

By adopting a structure wherein no gate electrode is provided in the position horizontally remote from the p base region 7a, as in the IGBT having the protruding-type emitter structure 50 according to embodiments of the invention, it is possible to reduce the previously described displacement current caused by the rise of silicon potential, and thus possible to suppress the rising of the gate voltage. The rise of collector current at turn-on time is equal to a decrease in current of reflux diode of an opposing arm in an inverter circuit, and when the previously described positive feedback loop has a strong effect, the rate of decrease of reflux diode current is extremely high. The higher the rate of decrease of reflux diode current, the higher a current change rate after a reverse recovery peak current time (hard recovery), and high spike voltage is generated between both terminals of the diode by the parasitic inductance of a main circuit, so that the diode may break. Although the diode does not break, voltage and current at a reverse recovery time vibrate, causing conductive noise. Also, when the rate of decrease of reflux diode current is high, the rate of rise of diode reverse voltage and the rate of decrease of IGBT collector voltage associated therewith are high. When these voltage change rates are high, the strength of radio emitted with a wiring metal inside and outside an IGBT module as an antenna increases. As radiation noise has adverse effects, such as malfunction, on peripheral electronics, to prevent this requires measures to cover a noise source device with a metal, or the like. The IGBT according to the embodiment of the invention is such that as the rate of rise of current at turn-on time is low, it is possible to suppress the previously described kinds of conductive noise and radiation noise.

Exemplary Embodiment

1200V FS IGBT

Figure 19B:
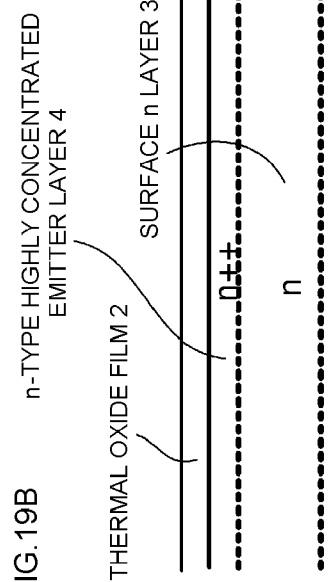
FIGS. 19A and 19B are main portion sectional views for illustrating a process of manufacturing the IGBT having the protruding-type emitter structure of embodiments of the invention (1).
Figure 19A:
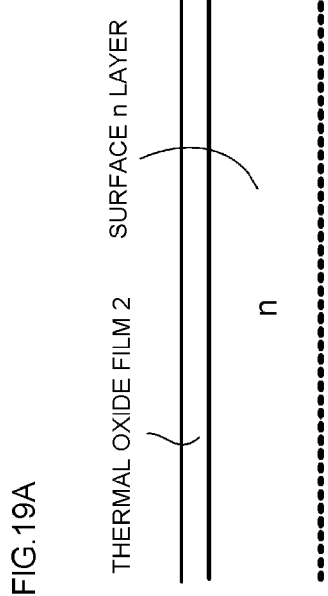
Figure 20:
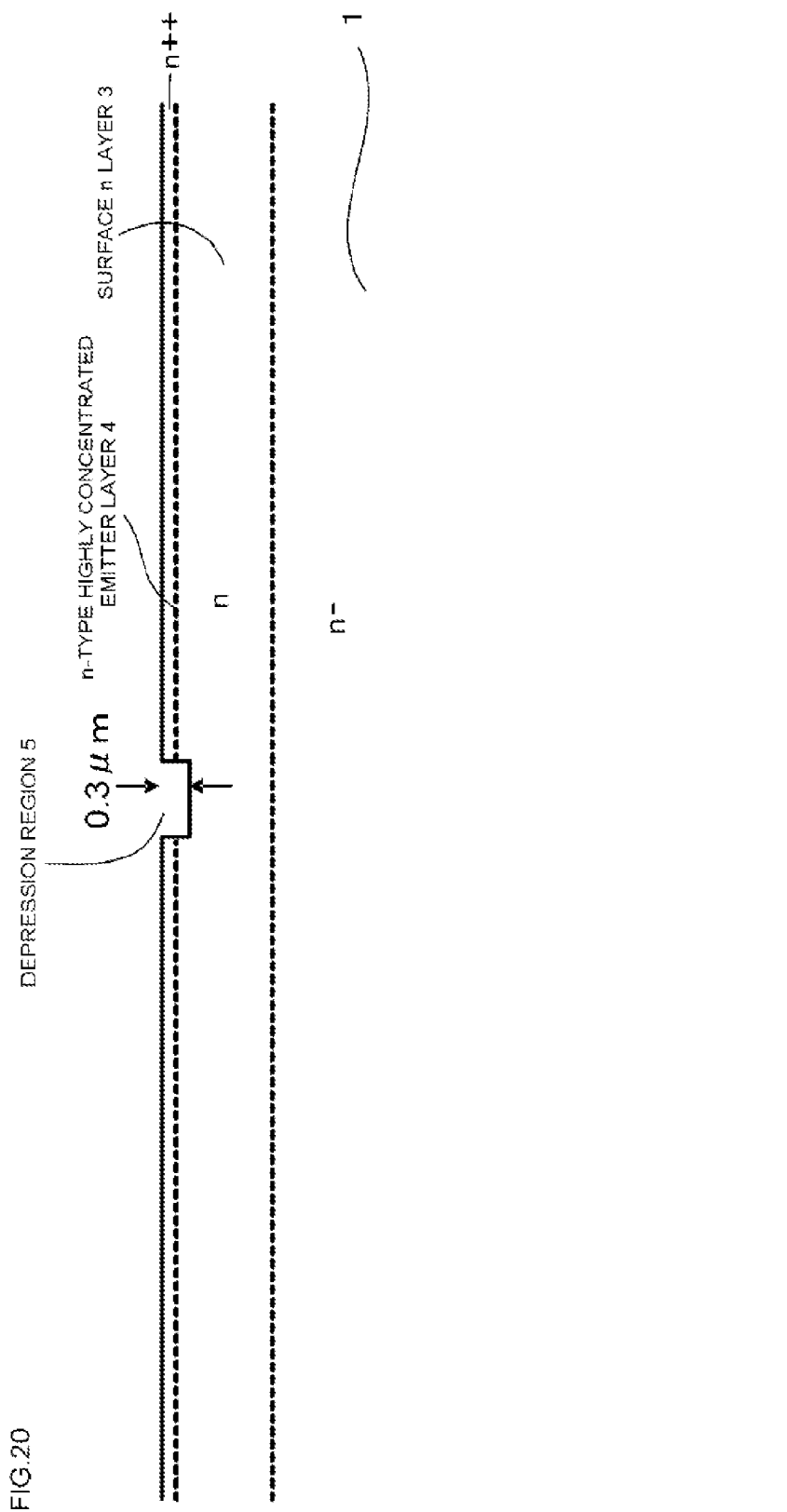
FIG. 20 is a main portion sectional view for illustrating a further process of manufacturing the IGBT having the protruding-type emitter structure of embodiments of the invention.

FIGS. 19A through 27 are main portion sectional views showing, in order, processes of manufacturing an FS IGBT with a rated withstand voltage of 1200V relating to the MOS type semiconductor device of embodiments of the invention. Hereafter, a description will be given, referring to FIGS. 19A through 27, of processes of manufacturing the 1200V IGBT according to embodiments of the invention. An n-FZ silicon semiconductor substrate 1 with a resistivity of 60 Ωcm (hereafter, a silicon substrate, simply a substrate or a drift layer), whose principal surface is a (100) surface, is used as a material input into the manufacturing processes. Firstly, a 350 angstrom thick thermal oxide film 2 is grown on the principal surface of the silicon substrate 1, and a $1.0 \times 10^{13}$ cm$^{-2}$ dose of phosphorus ion is implanted by an acceleration energy of 100 keV and drive diffused, thereby forming a surface n layer 3 (a first conductive type second region) (FIG. 19A). A $4.0 \times 10^{15}$ cm$^{-2}$ dose of arsenic ion is implanted by an acceleration energy of 120 keV, thus forming an n-type highly concentrated emitter layer 4 (FIG. 19B). One portion of the surface oxide film is dry etched away by patterning, and the silicon substrate 1 is selectively etched at a depth of 0.3 μm with a resist film and oxide film as a mask, thus forming a depression region 5. As the junction depth of the n-type highly concentrated emitter layer 4 (n$^{++}$) is shallow in the order of 0.2 μm, a portion corresponding to the depression region 5 of the n-type highly concentrated emitter layer 4 (n$^+$) is completely removed, and the surface n layer 3 (first conductivity type second region) therebelow is exposed. When observed from above, the plan view shape of a basic cell is a type of stripe, and the plan view pattern of the depression region 5 is of a structure wherein a plurality of rectangles are intermittently formed in the direction of the long side of the stripe (FIG. 20).

Figure 21:
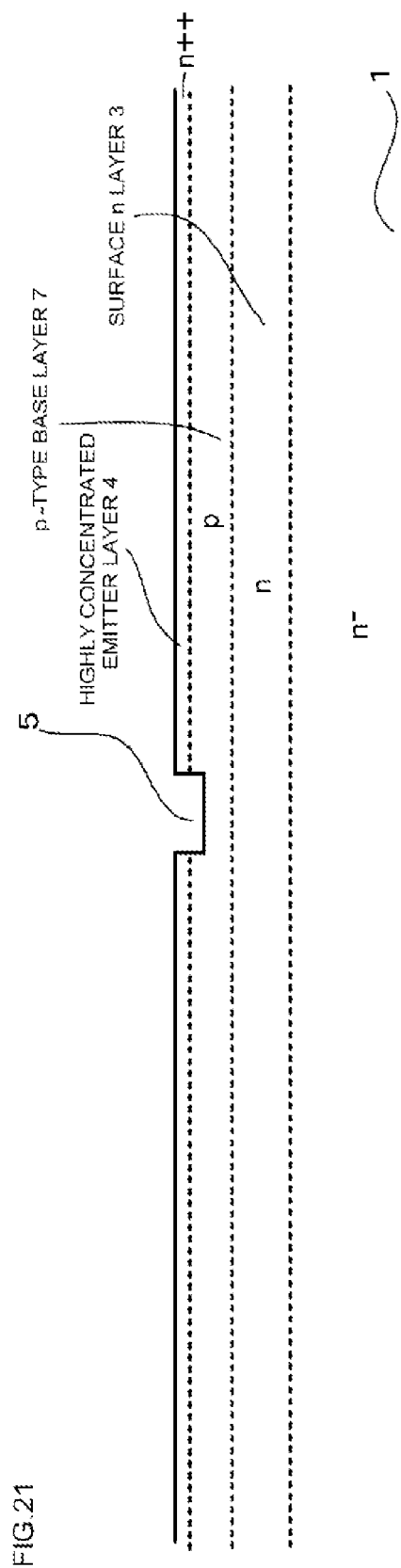
FIG. 21 is a main portion sectional view for illustrating a further process of manufacturing the IGBT having the protruding-type emitter structure of embodiments of the invention.
Figure 22:
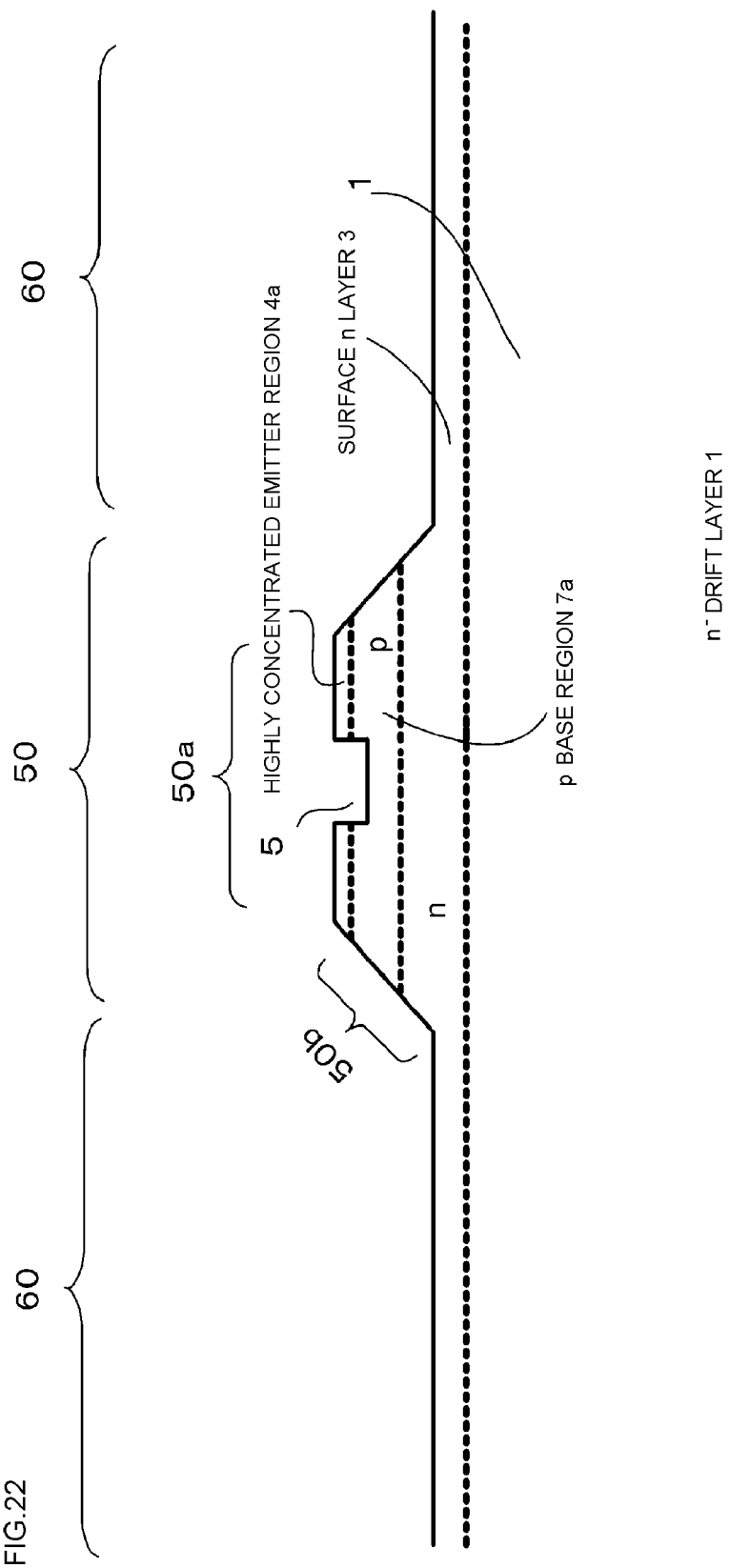
FIG. 22 is a main portion sectional view for illustrating a further process of manufacturing the IGBT having the protruding-type emitter structure of embodiments of the invention.

A $9.0 \times 10^{13}$ cm$^{-2}$ dose of boron ion is implanted into the whole surface of the silicon substrate 1 by an acceleration energy of 150 keV, thus forming a p-type base layer 7 (FIG. 21). After the patterning, the vicinity of the depression region 5 is removed from the surface of the silicon substrate 1 by isotropic plasma etcher, and etched and dug at a depth of 1.5 μm. The n-type highly concentrated emitter layer 4 and p-type base layer 7 are completely removed from the bottom portion of the silicon substrate 1 of the depression flat portion 60 formed by the digging, and an n-type highly concentrated emitter region 4a (a first conductivity type first region) and the p-type base region 7a (second conductivity type region) are left behind as the protruding-type emitter structure 50 (protruding semiconductor region) with the depression region 5 as the center (FIG. 22). As the area of a top flat portion 50a of the protruding-type emitter structure 50 substantially reflects the area of the p base region 7a, and the area of the etched depression flat portion 60 around the protruding-type emitter structure 50 reflects the area of the surface n layer 3 (first conductivity type second region) other than the p base layer 7a, the smaller the area of the top flat portion, the lower the area ratio of the p base region 7a, and an IE effect improves.

Figure 23:
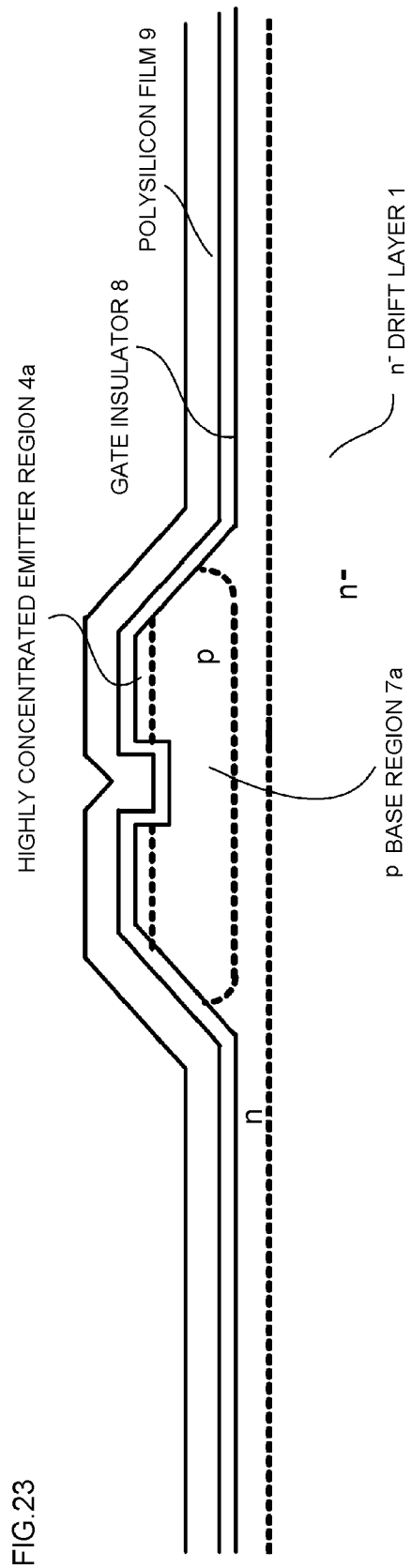
FIG. 23 is a main portion sectional view for illustrating a further process of manufacturing the IGBT having the protruding-type emitter structure of embodiments of the invention.
Figure 24:
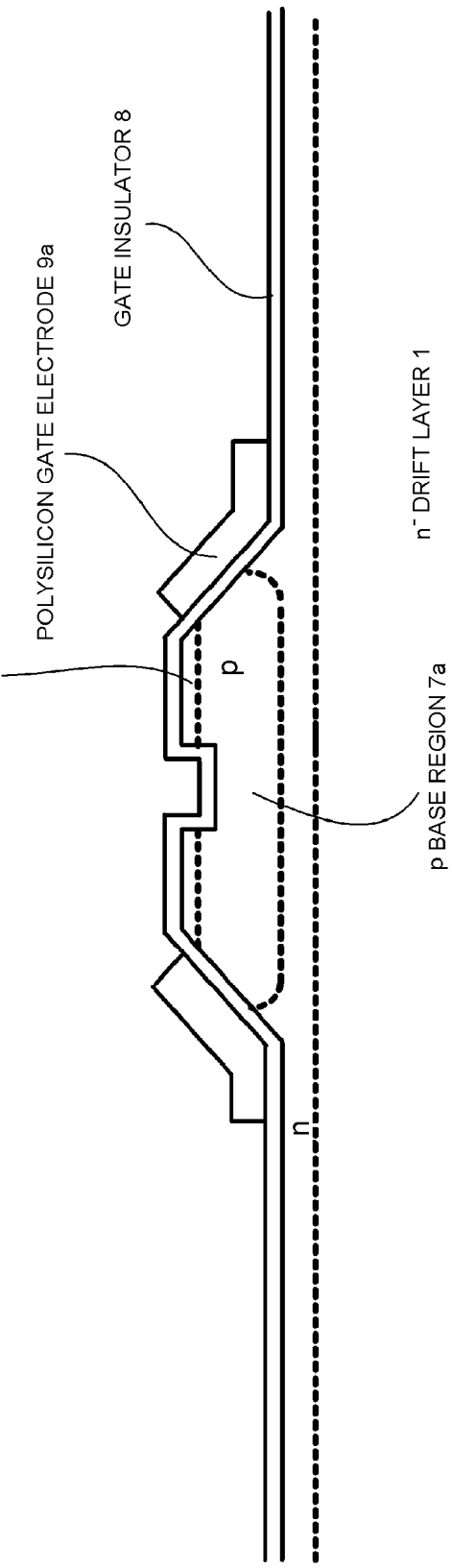
FIG. 24 is a main portion sectional view for illustrating a further process of manufacturing the IGBT having the protruding-type emitter structure of embodiments of the invention.

The gate insulator 8 is grown to 800 angstroms, at 900° C., on the surface of the silicon substrate 1 in the manufacturing process shown in FIG. 22. At the same time, a boron layer (the p base region 7a) is annealed. Furthermore, a 0.5 μm thick polysilicon film 9 is deposited (FIG. 23). The polysilicon film 9 is etched by patterning and isotropic plasma etcher, thus forming a polysilicon gate electrode 9a (FIG. 24). One end portion of the polysilicon gate electrode 9a is positioned above the n-type highly concentrated emitter region 4a of an inclined portion 50b between the top flat portion 50a of the protruding-type emitter structure 50 and the depression flat portion 60. By the one end portion of the polysilicon gate electrode 9a being positioned in this way, it is possible to minimize the area of the top flat portion 50a, and thus possible to realize a reduction in on voltage by the improvement in the IE effect. The other end portion of the polysilicon gate electrode 9a exists in a position not remote from the top flat portion 50a. Specifically, a design is adopted such that the distance of overlap of the polysilicon gate electrode 9a with the surface n layer 3 (first conductivity type second region) is 5 μm or less. By providing this kind of overlap distance, it is possible to reduce displacement current flowing into the gate circuit side at turn-on time, and thus possible to suppress the rate of rise of collector current. That is, as the silicon surface potential in a position remote from the top flat portion 50a of the protruding-type emitter structure 50 rises greatly at turn-on time, it is possible, by no gate electrode being provided on a region in the remote position, to reduce the displacement current passing through the gate insulator. The surface n layer 3 (first conductivity type second region) is a region with an impurity concentration higher than that of an n-type semiconductor substrate, but may remain as the n-type semiconductor substrate.

Figure 25:
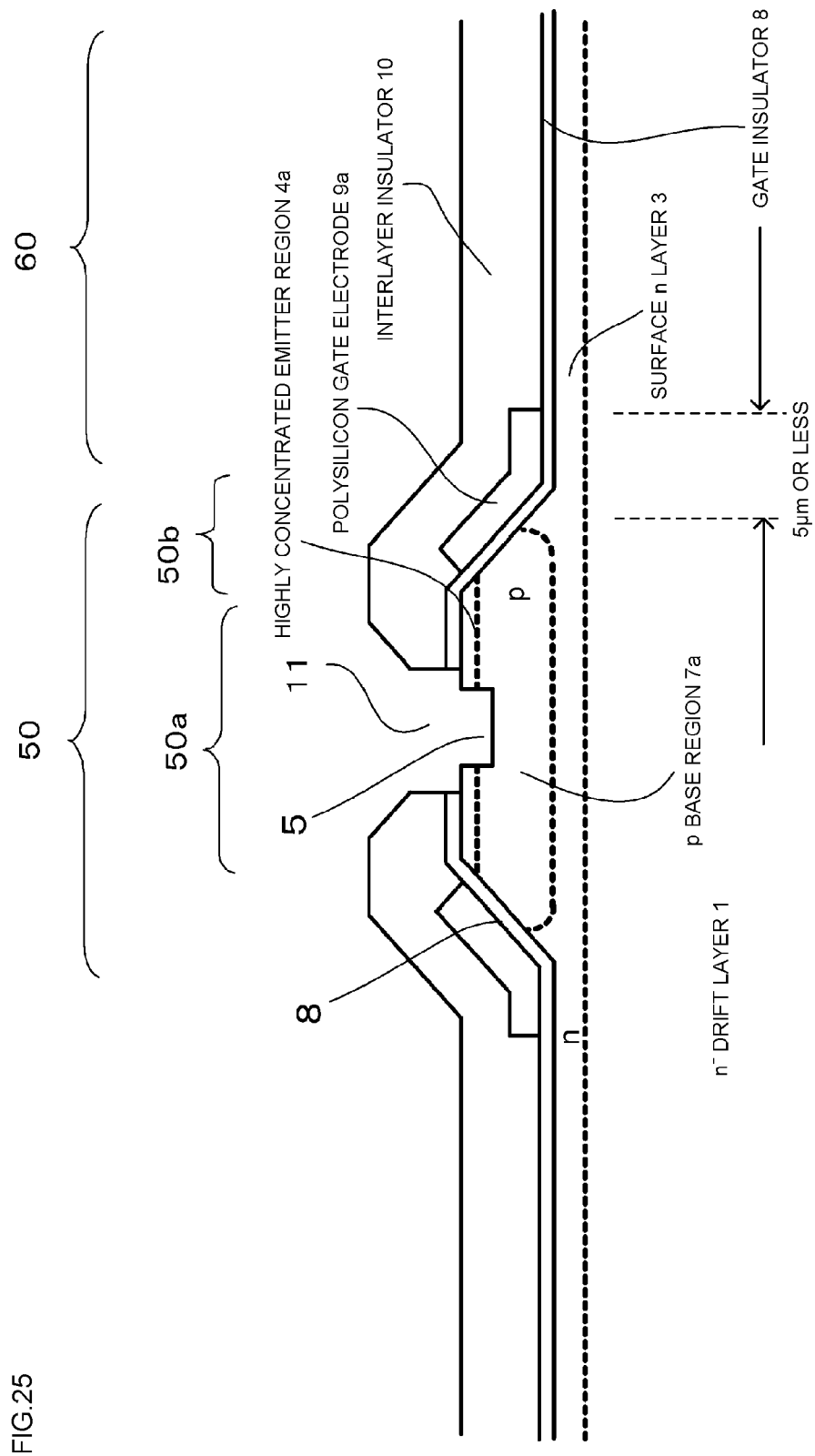
FIG. 25 is a main portion sectional view for illustrating a further process of manufacturing the IGBT having the protruding-type emitter structure of embodiments of the invention.
Figure 26:
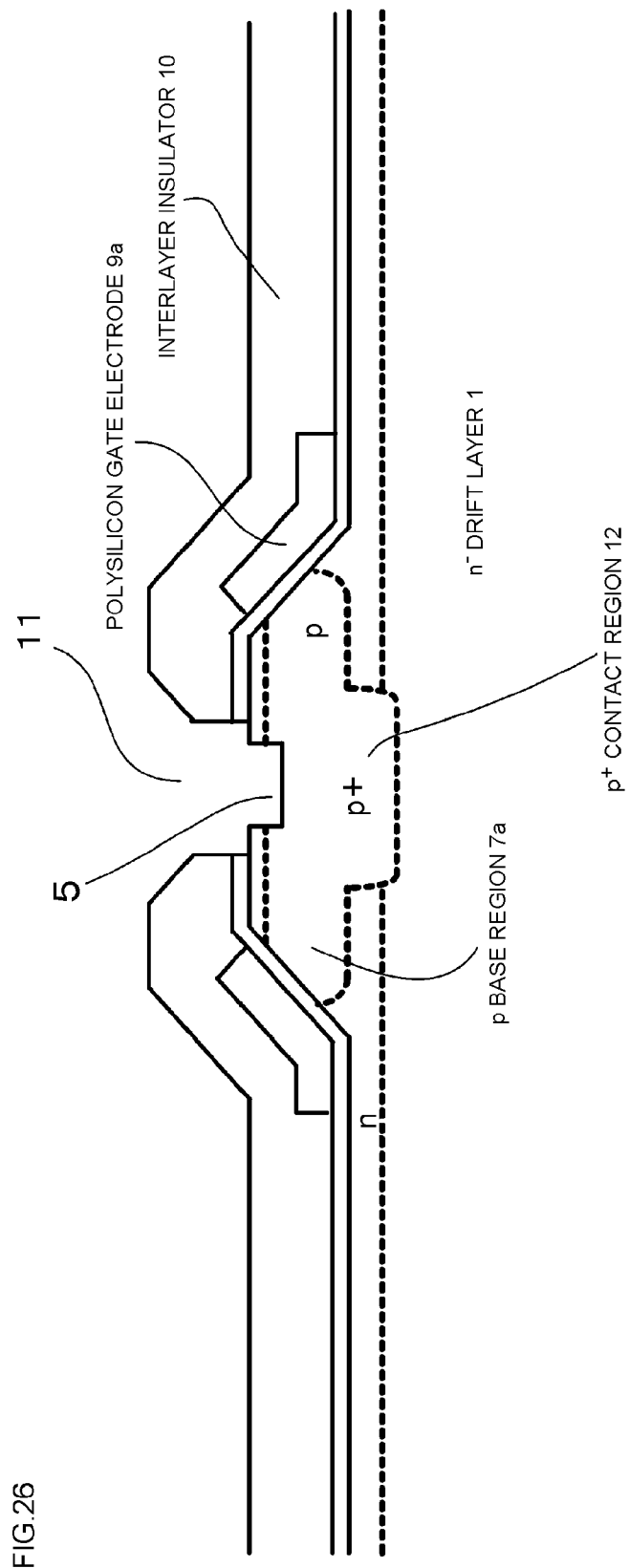
FIG. 26 is a main portion sectional view for illustrating a further process of manufacturing the IGBT having the protruding-type emitter structure of embodiments of the invention.

A high temperature oxide (HTO) film and a boro phospho silicate glass (BPSG) film are sequentially deposited as an interlayer insulator 10, a contact hole 11 is formed in a portion of the interlayer dielectric film 10 opposite to the depression region 5 of the top flat portion 50a of the protruding-type emitter structure 50 by patterning and etching, and boron is ion implanted from the contact hole 11 (FIG. 25). Subsequently, 30-minute annealing is carried out at 1000° C. in a nitrogen atmosphere, thus forming a p$^+$ contact region 12 (FIG. 26).

Figure 27:
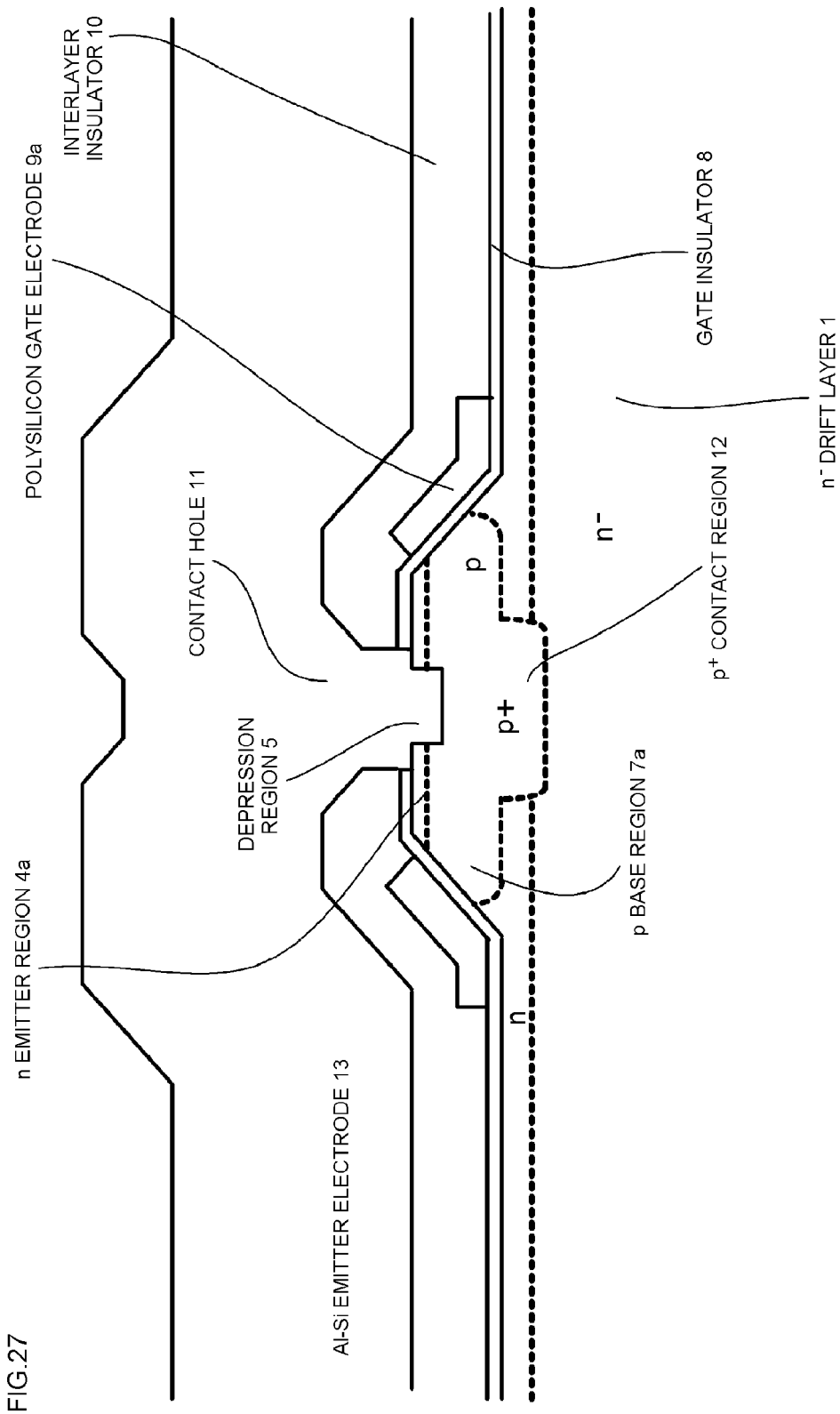
FIG. 27 is a main portion sectional view for illustrating a further process of manufacturing the IGBT having the protruding-type emitter structure of embodiments of the invention.

An Al—Si electrode film is formed by sputtering, and the emitter electrode 13 is formed by patterning and etching (FIG. 27). The emitter electrode 13 is spin coated with a polyimide film as a passivation film (not shown), and an electrode pad structure (not shown) is formed by patterning and etching. Backside silicon is mechanically ground, and subsequently, the thickness of the silicon substrate is reduced to 120 μm by overall etching. Proton ion and boron ion are implanted into the backside, and an n-type buffer layer (not shown) and a p-type collector layer (not shown) are formed by a subsequent 400° C. heat treatment. Finally, a four-layered metal film structure formed from aluminum, titanium, nickel, and silver is formed by sputtering into a collector electrode (not shown), and a wafer process is completed. A wafer is cut to a chip size, thereby completing a 1200V FS (Field Stop) IGBT chip.

When the collector is set to be higher in potential than the emitter with the gate set to be equal in potential to the emitter, the depletion layer extends from the pn junction between the p-type base region 7a and p+contact region 12 of an active portion and the n-type silicon substrate 1, and blocks the applied voltage. When the collector is set to be higher in potential than the emitter with the gate set to be higher in potential than the emitter, electrons flow into a bulk through an n-type inversion layer (n channel) formed below the gate electrode 9a, pass through the backside pn junction (collector junction), and reach the backside collector electrode. Holes are injected from the backside pn junction, reach the surface p-type base region 7a, and are drawn out to the emitter electrode 13. As a result of this, the bulk (the n−drift layer 1 formed of the silicon substrate 1) causes conductivity modulation, and decreases in resistance, and it is possible to cause large current to flow. The IGBT according to the embodiment is such that as the width of the p base region 7a is narrow, and the area ratio of the p base region 7a to the etched bottom portion 60 is low, the on voltage is reduced.

The output characteristics of an IGBT having a heretofore known protruding-type emitter structure and the IGBT having the improved protruding-type emitter structure with the reduced width of the p base region 7a according to embodiments of the invention are shown so as to be comparable using the output characteristic diagram formed of a relationship between collector current and collector voltage in FIG. 17. According to FIG. 17, the on voltage of the IGBT having the improved protruding-type emitter structure according to embodiments of the invention shows that the collector voltage (on voltage) is reduced by approximately 0.1V by on current with a collector current of 100 A, compared with that of the IGBT having the heretofore known protruding-type emitter structure. Also, with the IGBT having the improved protruding-type emitter structure with the reduced width of the p base region 7a according to embodiments of the invention, when the width of the gate electrode 9a is reduced, the rate of rise of current at turn-on time decreases, and it is possible to hold down the rate of rise of the reverse voltage of reflux diode of the opposing arm even by using low gate resistance. Because of this, it is possible to reduce radiation noise and lower turn-on loss. In the IGBT according to embodiments of the invention wherein the width of the p base region 7a is narrow, a relationship between the rate of rise of reverse voltage of the diode of the opposing arm at turn-on time and the turn-on loss per rated current is shown in FIG. 18 so as to be comparable with a structure wherein the width of the gate electrode 9a is wide. In FIG. 18, the rate of rise of diode reverse voltage is a value when the current is 1/10 lower than the rated current at room temperature, and the turn-on loss is a rated current value at 150° C. The reason for setting the rate of rise of diode reverse voltage to the value at room temperature and low current is that the value is likely to be the maximum in these conditions.

It is possible to realize an IGBT wherein the IE effect is great and the on voltage is low. Also, it is possible to hold down the rate of rise of collector current at turn-on time and reduce radiation noise.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A MOS type semiconductor device, comprising:
   a stripe-shaped plan-view pattern of protruding semiconductor region on one principal surface of a first conductivity type semiconductor substrate, the protruding semiconductor region having
      a second conductivity type region sandwiched between an upper side first conductivity type first region and a lower side first conductivity type second region,
      a top flat portion including a depression region with a depth reaching the second conductivity type region from a surface of the upper side first conductivity type first region, and
      an inclined portion between the top flat portion and a bottom flat portion around the protruding semiconductor region; and
   a gate electrode covering a surface of the inclined portion of the second conductivity type region across a gate insulator, the gate electrode having
      a first end portion on a surface within the inclined portion, and
      a second end portion on a surface of the lower side first conductivity type second region on the side of and in the vicinity of the second conductivity type region,
   the gate electrode terminating on the inclined portion without extending onto the top flat portion.

2. The MOS type semiconductor device according to claim 1, wherein
   the second end portion covers the surface of the lower side first conductivity type second region across the gate insulator by a distance of 5 µm or less from the second conductivity type region.

3. The MOS type semiconductor device according to claim 1, further comprising:
   a first metal main electrode across an interlayer insulator on the gate electrode, wherein
   the first metal main electrode is in common conductive contact, through a contact hole provided in the interlayer insulator, with a first conductivity type first region surface exposed in the depression region on the top flat portion and a second conductivity type contact region surface inserted from the contact hole.

4. The MOS type semiconductor device according to claim 2, further comprising:
   a first metal main electrode across an interlayer insulator on the gate electrode, wherein
   the first metal main electrode is in common conductive contact, through a contact hole provided in the interlayer insulator, with a first conductivity type first region surface exposed in the depression region on the top flat portion and a second conductivity type contact region surface inserted from the contact hole.

5. The MOS type semiconductor device according to claim 1, wherein
   the lower side first conductivity type second region is the first conductivity type semiconductor substrate or a region higher in impurity concentration than the first conductivity type semiconductor substrate.

6. The MOS type semiconductor device according to claim 1, wherein
   the MOS type semiconductor device is an IGBT.

* * * * *